(12) United States Patent
Dosho et al.

(10) Patent No.: US 8,941,526 B2
(45) Date of Patent: Jan. 27, 2015

(54) TIME INTEGRATOR AND ΔΣ TIME-TO-DIGITAL CONVERTER

(71) Applicant: Panasonic Corporation, Osaka (JP)

(72) Inventors: Shiro Dosho, Osaka (JP); Masao Takayama, Hyogo (JP); Takuji Miki, Kyoto (JP)

(73) Assignee: Panasonic Intellectual Property Management Co. Ltd., Osaka (JP)

( * ) Notice: Subject to any disclaimer, the term of this patent is extended or adjusted under 35 U.S.C. 154(b) by 0 days.

(21) Appl. No.: 14/447,315

(22) Filed: Jul. 30, 2014

(65) Prior Publication Data

US 2014/0340250 A1     Nov. 20, 2014

Related U.S. Application Data

(63) Continuation of application No. PCT/JP2013/000288, filed on Jan. 22, 2013.

(30) Foreign Application Priority Data

Feb. 15, 2012   (JP) ................................. 2012-030650

(51) Int. Cl.
    *H03M 1/50*         (2006.01)
    *G06G 7/184*        (2006.01)
    *H03M 3/02*         (2006.01)
    *H03H 19/00*        (2006.01)

(52) U.S. Cl.
    CPC ............... *G06G 7/184* (2013.01); *H03M 3/02* (2013.01); *H03H 19/004* (2013.01)
    USPC .......................................... 341/166; 341/143

(58) Field of Classification Search
    USPC ............. 341/143, 53, 152, 166; 327/156, 158
    See application file for complete search history.

(56) References Cited

U.S. PATENT DOCUMENTS 6,493,305 B1 * 12/2002 Hayashi et al. ............ 369/59.12
(Continued)

FOREIGN PATENT DOCUMENTS

| | | |
|---|---|---|
| EP | 0 670 632 A1 | 9/1995 |
| JP | 07-240670 A | 9/1995 |
| JP | 2000-295097 A | 10/2000 |

OTHER PUBLICATIONS

Jose M. de la Rosa, Sigma-Delta Modulators: Tutorial Overview, Design Guide, and State-of-the-Art Survey, IEEE Transactions on Circuits and Systems. I: Regular Papers, vol. 58, No. 1, Jan. 2011, pp. 1-21.

(Continued)

*Primary Examiner* — Brian Young
(74) *Attorney, Agent, or Firm* — McDermott Will & Emery LLP

(57) ABSTRACT

A time integrator integrates time axis information represented by a phase difference between two signals. The time integrator includes a pulse generation circuit configured to convert a time difference between edges of two input signals to a difference between pulse widths of two pulse signals, and to output the two pulse signals, a load circuit having load characteristics changed by the two pulse signals, and an oscillation circuit coupled to the load circuit, and having an oscillation frequency changing in accordance with the load characteristics of the load circuit. An output of the oscillation circuit is output as a result of time integration.

23 Claims, 20 Drawing Sheets

(56) References Cited

U.S. PATENT DOCUMENTS 6,633,991 B1 * 10/2003 Goldrian ................. 713/400
6,819,729 B2 * 11/2004 Takagi ..................... 375/376
7,486,120 B2 *  2/2009 Kubo ....................... 327/158

OTHER PUBLICATIONS

International Search Report issued in the International Application No. PCT/JP2013/000288 with Date of mailing Feb. 26, 2013, with English Translation.

* cited by examiner 121  122

COUPLED TO NODE
OF OSCILLATOR

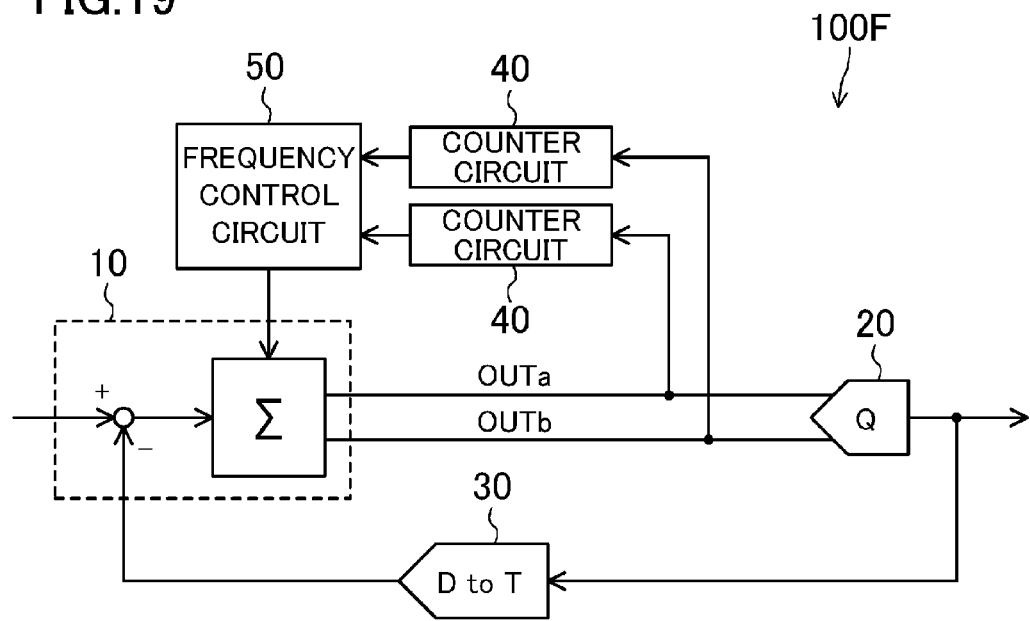
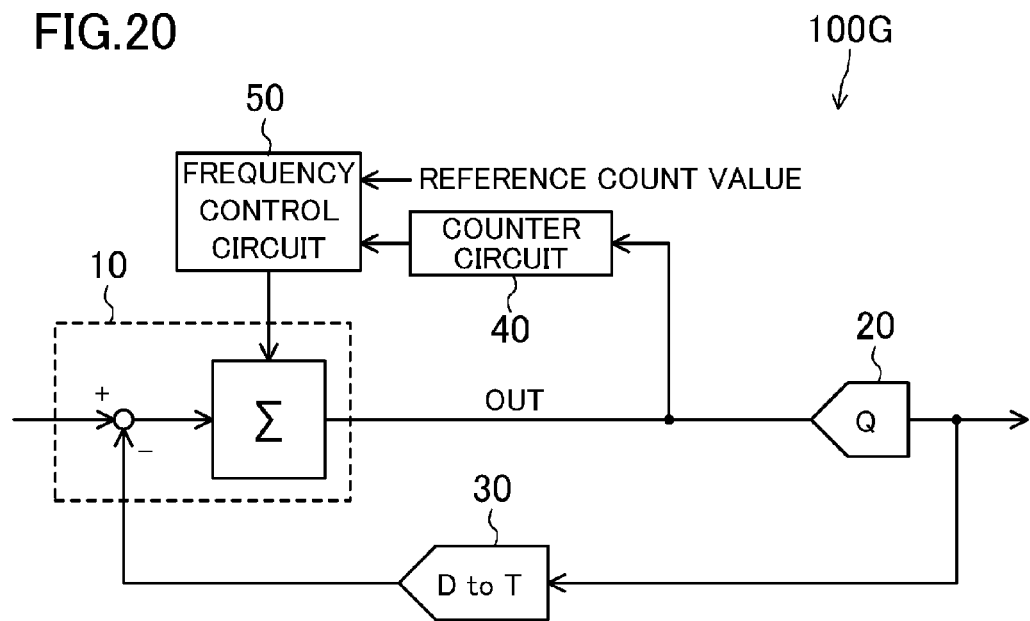

TIME INTEGRATOR AND ΔΣ TIME-TO-DIGITAL CONVERTER

CROSS-REFERENCE TO RELATED APPLICATIONS

This is a continuation of International Application No. PCT/JP2013/000288 filed on Jan. 22, 2013, which claims priority to Japanese Patent Application No. 2012-030650 filed on Feb. 15, 2012. The entire disclosures of these applications are incorporated by reference herein.

BACKGROUND

The present disclosure relates to time integrators integrating time axis information and ΔΣ time-to-digital converters performing ΔΣ modulation of the time axis information.

In recent years, with the development in mobile communication techniques, the performance of A/D converters used for communication systems has been rapidly improved. Out of them, ΔΣ A/D converters are particularly widely used for the communication systems, since they are less subject to output distortion and relatively easily provide higher SN ratios. See, for example, Jose M. de la Rosa, Sigma-Delta Modulators: Tutorial Overview, Design Guide, and State-of-the-Art Survey, IEEE TRANSACTIONS ON CIRCUITS AND SYSTEMS. I: REGULAR PAPERS, VOL. 58, NO. 1, JANUARY 2011, pp. 1-21.

ΔΣ A/D converters require integrators. In general, operational amplifiers in which a capacitive element is inserted in a negative feedback path is used as integrators. That is, an input signal is converted to a current to charge and discharge the capacitive element, thereby integrating the input signal.

In recent years, as miniaturization in LSIs progresses, the operating voltages of the LSIs have been reduced. Thus, the SN ratios of signals are becoming difficult to improve in signal processing in a voltage direction. There is a dire need to process signals using the analog quantity along the time axis, that is, time axis information. The time axis information defined here is obtained by performing phase modulation of edges of clock signals with an information signal. So far, however, no promising circuit has been suggested as a circuit integrating time axis signals. In providing a ΔΣ time-to-digital converter processing time axis information, the time axis information needs to be converted back to voltage signals for integration.

Therefore, there is a need for a time integrator integrating time axis information represented by a phase difference between two signals, and a ΔΣ time-to-digital converter performing ΔΣ modulation of the time axis information.

SUMMARY

A time integrator according to an aspect of the present disclosure integrates time axis information represented by a phase difference between two signals. The time integrator includes a pulse generation circuit configured to convert a time difference between edges of two input signals to a difference between pulse widths of two pulse signals, and to output the two pulse signals; a load circuit having load characteristics changed by the two pulse signals; and an oscillation circuit coupled to the load circuit, and having an oscillation frequency changing in accordance with the load characteristics of the load circuit. An output of the oscillation circuit is output as a result of time integration.

With this configuration, the oscillation frequency of the oscillation circuit changes in accordance with the phase difference between the two signals. The phase difference is accumulated as a phase shift of the oscillation circuit, that is, integrated.

Specifically, the load circuit includes a plurality of variable capacitance circuits, each being configured to receive one or the other of the two pulse signals, and having a capacitance value varying in accordance with a logic level of the received pulse signal. The oscillation circuit includes an oscillator coupled to one(s) of the variable capacitance circuits receiving the one of the two pulse signals, and having an oscillation frequency changing in accordance with a capacitance value(s) of the coupled variable capacitance circuit(s), and another oscillator coupled to another one(s) of the variable capacitance circuits receiving the other one of the two pulse signals, and having an oscillation frequency changing in accordance with a capacitance value(s) of the coupled variable capacitance circuit(s).

Alternatively, the load circuit includes a plurality of variable capacitance circuits, each being configured to receive one or the other of the two pulse signals, and having a capacitance value varying in accordance with a logic level of the received pulse signal. The oscillation circuit includes an oscillator coupled to the plurality of variable capacitance circuits, and having an oscillation frequency changing in accordance with a total capacitance value of the coupled variable capacitance circuits.

The time integrator may be modified so that the pulse generation circuit includes another pulse generation circuit; and the load circuit includes another load circuit, and another two signals may be input to the another pulse generation circuit. A ΔΣ time-to-digital converter according to an aspect of the present disclosure includes the time integrator modified as above, a time quantizer configured to quantize an output of the time integrator, and a digital-to-time converter configured to convert a quantized output of the time quantizer to a time difference between edges of two signals, and to output the two signals. The two signals output from the digital-to-time converter are input to one of the two pulse generation circuits of the time integrator.

With this configuration, the time axis information represented by the phase difference between the two signals is subjected to ΔΣ modulation without converting the signals back to voltage signals, thereby performing highly accurate time-to-digital conversion.

The time integrator may output two signals having a phase difference corresponding to the result of time integration. The time quantizer may quantize the phase difference between the two signals output from the time integrator.

Alternatively, the time integrator may output a signal reflecting the result of time integration as a phase difference from a sampling clock signal. The time quantizer may quantize a phase difference between the sampling clock signal and the signal output from the time integrator.

The oscillation circuit of the time integrator may include a ring oscillator formed by coupling a plurality of delay elements in a ring. The time integrator may output a multi-bit signal formed by outputs of the delay elements forming the ring oscillator. The time quantizer may latch the multi-bit signal output from the time integrator at timing of a sampling clock signal, and convert an output of the time integrator to a multi-bit value. This allows the ΔΣ time-to-digital converter to output multi-bit signal.

The above-described ΔΣ time-to-digital converter may further include another one of the time integrator modified as above. An output of the another time integrator may be coupled to an input of the time integrator. The two signals output from the digital-to-time converter may be input to one of two pulse generation circuits of the another time integrator. As a result, second-order time integration characteristics are provided.

The above-described ΔΣ time-to-digital converter may further include a counter circuit configured to count the oscillation frequency of the oscillation circuit of the time integrator, and a frequency control circuit configured to control the oscillation frequency of the oscillation circuit based on an output of the counter circuit. This stabilizes the oscillation frequency of the oscillation circuit of the time integrator, thereby stabilizing the operation of the ΔΣ time-to-digital converter.

The above-described ΔΣ time-to-digital converter may further includes a phase slip detection circuit configured to detect phase slip of the oscillation circuit of the time integrator; and a correction circuit configured to correct a digital value output from the time quantizer based on an output of the phase slip detection circuit. This corrects an off-set error caused by the phase slip of the oscillation circuit of the time integrator, thereby improving the conversion accuracy of the ΔΣ time-to-digital converter.

BRIEF DESCRIPTION OF THE DRAWINGS

FIG. 19 is a configuration diagram of a ΔΣ time-to-digital converter according to a twelfth embodiment.
FIG. 20 is a configuration diagram of a ΔΣ time-to-digital converter according to a thirteenth embodiment.

DETAILED DESCRIPTION

Embodiments of the present disclosure will be described hereinafter with reference to the drawings.

Time Integrator

First Embodiment

Figure 1:
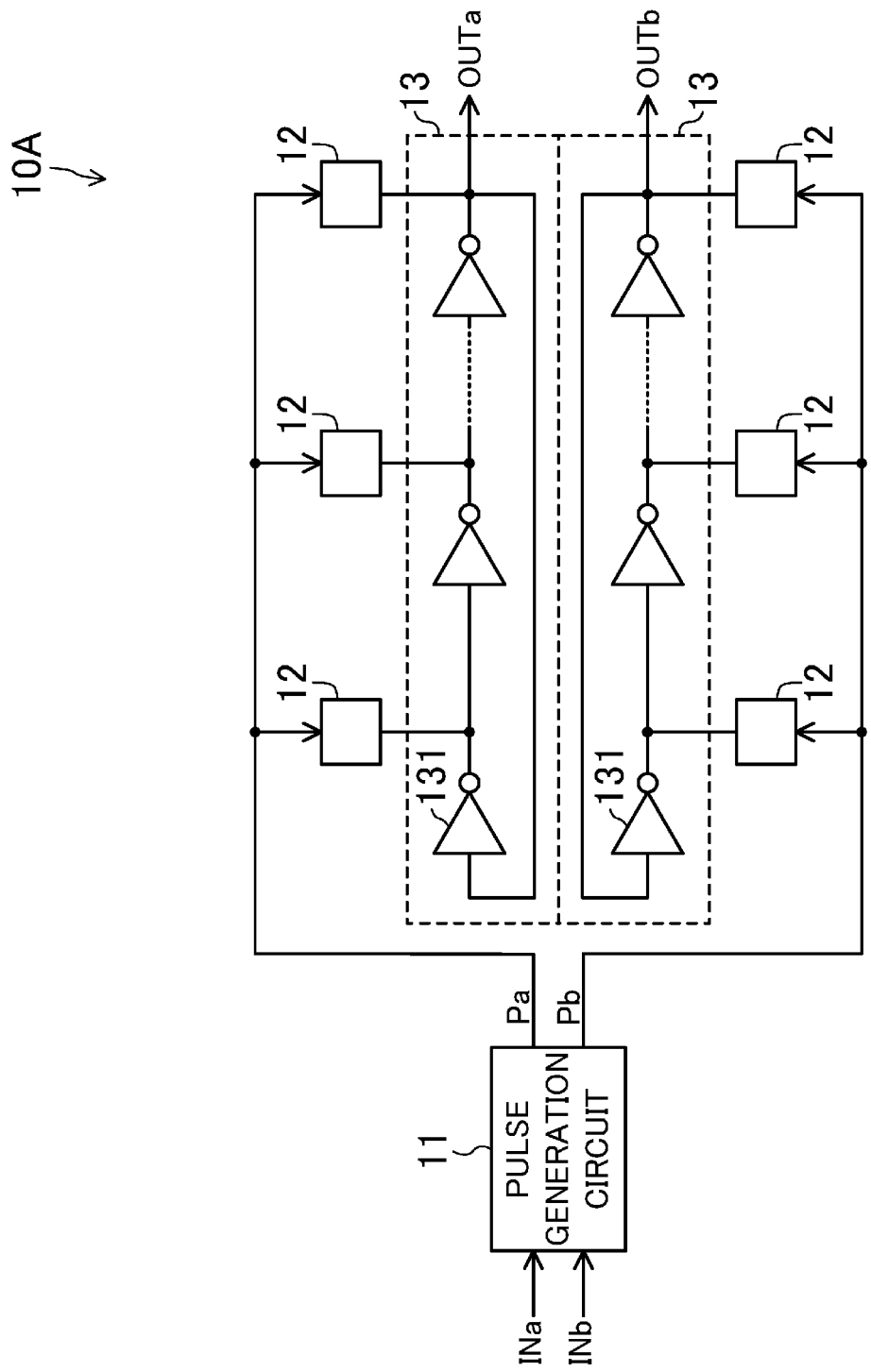
FIG. 1 is a configuration diagram of a time integrator according to a first embodiment.

FIG. 1 illustrates the configuration of a time integrator according to a first embodiment. A time integrator 10A according to this embodiment integrates time axis information represented by the phase difference between two signals INa and INb, and outputs two signals OUTa and OUTb. The phase difference between OUTa and OUTb represents a result of time integration.

The time integrator 10A includes a pulse generation circuit 11, a plurality of variable capacitance circuits 12, and two ring oscillators 13. The pulse generation circuit 11 converts the time difference between the edges of INa and INb to a difference between pulse widths of two pulse signals Pa and Pb, and outputs Pa and Pb.

Figure 2:
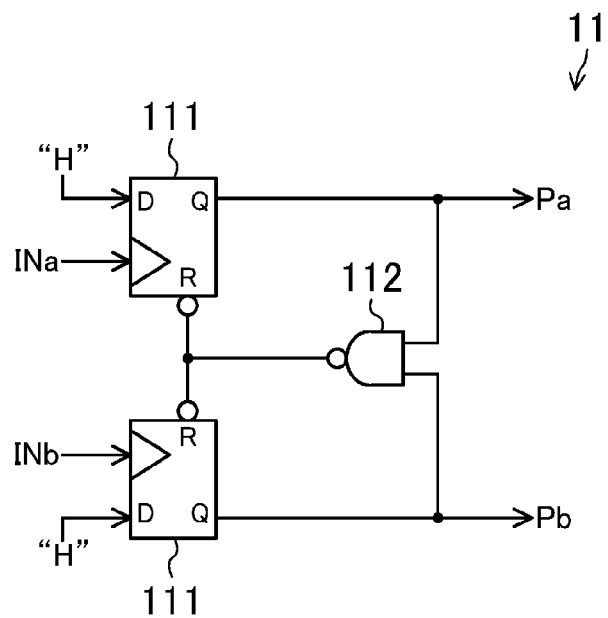
FIG. 2 is a configuration diagram of an example pulse generation circuit.

FIG. 2 illustrates an example configuration of the pulse generation circuit 11. The pulse generation circuit 11 includes, for example, two D flip-flops (DFFs) 111 and a NAND gate 112. A logic level H is applied to the data inputs of the two DFFs 111. The two DFFs 111 receive Na and INb as clocks, and outputs Q outputs as Pa and Pb. The Q outputs of the DFFs 111 are input to the NAND gate 112. The output of the NAND gate 112 is coupled to reset inputs of the DFFs 111.

Figure 3:
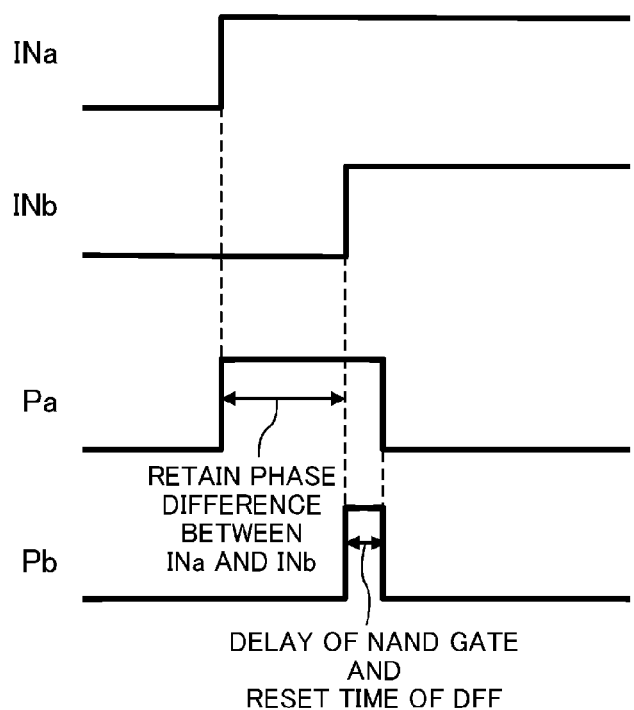
FIG. 3 is an input-output timing chart of the pulse generation circuit of FIG. 2.

FIG. 3 illustrates input and output timing of the pulse generation circuit 11 of FIG. 2. The time difference between the rising edges of INa and INb represents the time axis information. When INa and INb are input to the pulse generation circuit 11, the time difference between the rising edges of INa and INb is retained as a time difference between the starting edges of Pa and Pb. The terminal edges of Pa and Pb are at the same timing. That is, the pulse generation circuit 11 converts the phase difference between INa and INb to the difference between the pulse widths of Pa and Pb.

The configuration of FIG. 2 is an example. As long as the phase difference between INa and INb is converted to the difference between the pulse widths of Pa and Pb, a circuit configuration may be used in which the starting edges of Pa and Pb are at the same timing, and the time difference between the terminal edges is retained as the time difference between the rising edges of INa and INb.

Referring back to FIG. 1, the plurality of variable capacitance circuits 12 form, as a whole, a load circuit with load characteristics changed by Pa and Pb in the time integrator 10A. Pa or Pb is input to each of the variable capacitance circuits 12. The capacitance value of each variable capacitance circuit 12 varies in accordance with the logic level of the input pulse signal.

Figure 4:
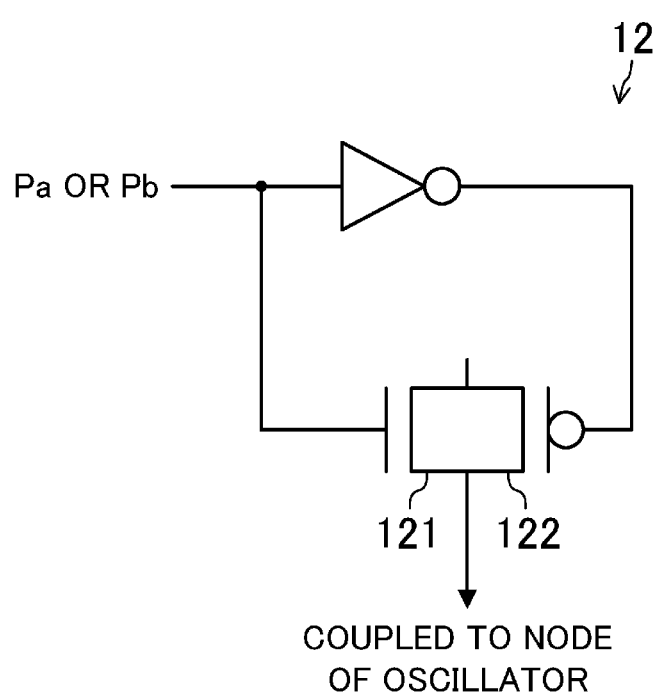
FIG. 4 is a configuration diagram of an example variable capacitance circuit.

FIG. 4 illustrates an example configuration of each variable capacitance circuit 12. The variable capacitance circuit 12 includes, for example, an NMOS transistor 121 and a PMOS transistor 122. The sources and the drains of the transistor 121 and 122 are coupled together. Pa or Pb is input as a control signal to the gate of the transistor 121. Logic inversion is input to the gate of the transistor 122. One of the coupled sources or drains is electrically floating. The other one is coupled to a predetermined node of the corresponding ring oscillator 13.

In the variable capacitance circuit 12 with the above-described configuration, when the control signal is L, the transistor 121 and 122 both turn off and the diffusion capacitance of one of the transistor 121 and 122 is applied to the ring oscillator 13. On the other hand, when the control signal is H, the transistor 121 and 122 both turn on and the channel capacitances of the transistor 121 and 122 are applied to the ring oscillator 13 in addition to the diffusion capacitance. That is, the capacitance value of the variable capacitance circuit 12 varies in accordance with the logic level of Pa and Pb. As such, the NMOS transistor 121 and the PMOS transistor 122 form the variable capacitance circuits 12 without using a capacitive element requiring relatively large circuit area, thereby reducing the circuit scale. In particular, since a large number of the variable capacitance circuits 12 are used in the time integrator 10A, it is largely advantageous in reducing the circuit scale. One of the transistor 121 or 122 may not be used.

Referring back to FIG. 1, the two ring oscillators 13 form, as a whole, an oscillation circuit with an oscillation frequency changing in accordance with the load characteristics of the load circuit, which is formed by the plurality of variable capacitance circuits 12 in the time integrator 10A. More specifically, each ring oscillator 13 is formed by coupling a plurality of delay elements 131 in a ring in negative feedback relation. The delay elements 131 are, for example, inverter circuits or differential input-output amplifiers. In one of the ring oscillators 13, the output node of each delay element 13 is coupled to one of the variable capacitance circuits 12 receiving Pa. In the other ring oscillator 13, the output node of each delay element 13 is coupled to one of the variable capacitance circuits 12 receiving Pb. OUTa and OUTb are output from preferred ones of the delay elements 131 of the one and the other one of the ring oscillators 13, respectively.

The oscillation frequency of each ring oscillator 13 changes in accordance with the capacitance values of the coupled variable capacitance circuits 12. Specifically, when the variable capacitance circuits 12 have high capacitance values, the load of the ring oscillator 13 increases to lower the oscillation frequency. On the other hand, when the variable capacitance circuits 12 have low capacitance values, the load of the ring oscillator 13 decreases to raise the oscillation frequency. That is, the oscillation frequencies of the ring oscillators 13 change independently from one another in accordance with the logic levels of Pa and Pb.

Assume that the oscillation frequencies of the two ring oscillators 13 are equal and there is no phase difference between OUTa and OUTb. If INa and INb having the time difference shown in FIG. 3 are input, the pulse widths of Pa and Pb differ. That is, the period when Pa is H is longer than the period when Pb is H by the time corresponding to the time difference between the rising edges of INa and INb. As a result, the period when the ring oscillator 13 coupled to the variable capacitance circuits 12 receiving Pa has a low oscillation frequency is longer than the period when the ring oscillator 13 coupled to the variable capacitance circuits 12 receiving Pb has a lower oscillation frequency by the time corresponding to the time difference between the rising edges of INa and INb. Since the oscillation frequencies of the two ring oscillators 13 differ, the phases of OUTa and OUTb differ by the time difference. Then, when new INa and INb are input and the oscillation frequencies between the two ring oscillators 13 become different, the time differences are accumulated as the phase difference between OUTa and OUTb. As such, the time differences between the rising edges of INa and INb are accumulated as the phase difference between OUTa and OUTb. Therefore, a result of integration of the time difference between the rising edges of INa and INb is known from the phase difference between OUTa and OUTb. That is, the phase difference between OUTa and OUTb represents the result of integration of the time difference between the rising edges of INa and INb.

As described above, this embodiment integrates the time axis information represented by the phase difference between the two input signals INa and INb.

Second Embodiment

Figure 5:
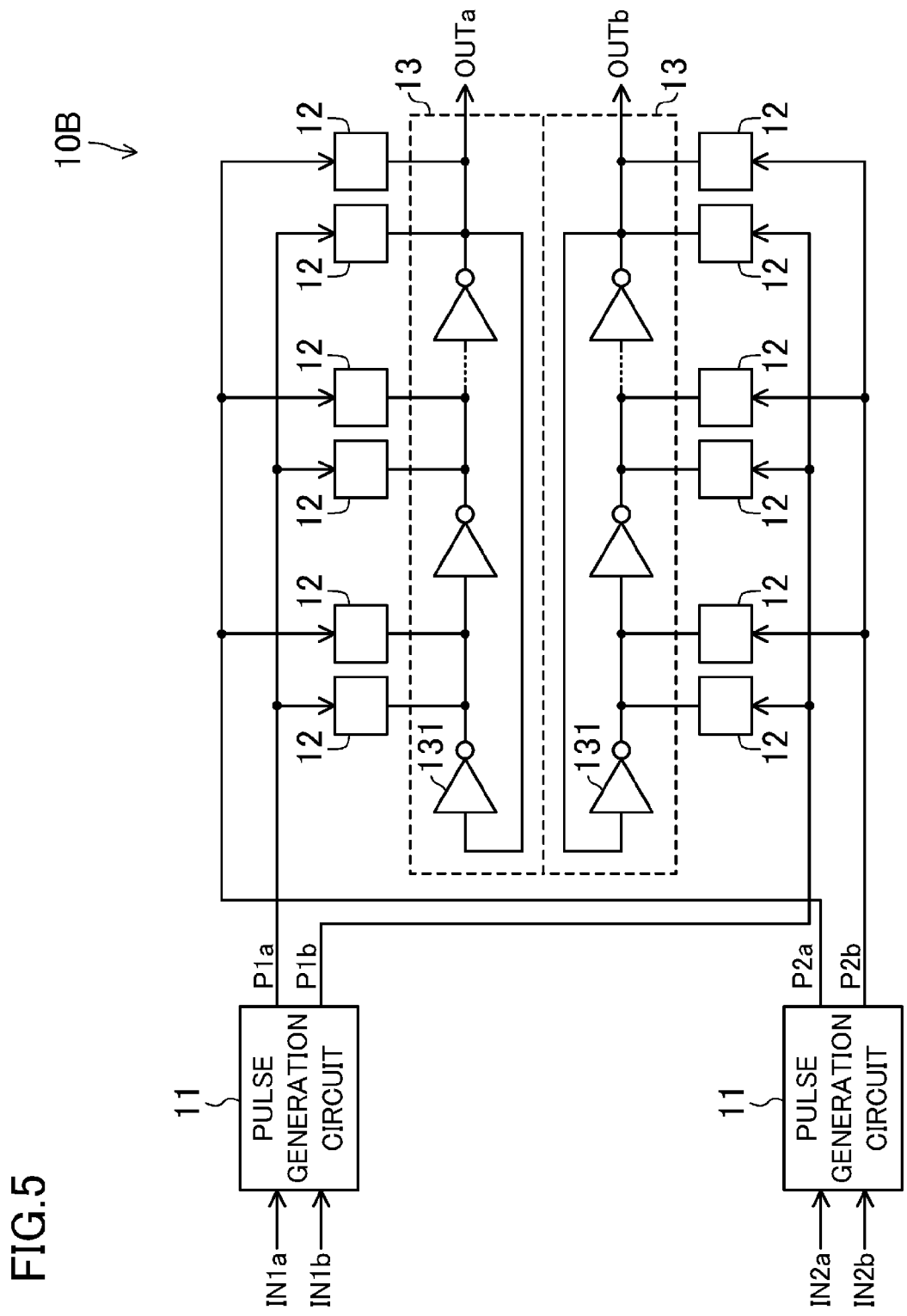
FIG. 5 is a configuration diagram of a time integrator according to a second embodiment.

FIG. 5 illustrates the configuration of a time integrator according to a second embodiment. A time integrator 10B according to this embodiment corresponds to the time integrator 10A according to the first embodiment, but has multiple inputs. Differences from the first embodiment will be particularly described below.

The time integrator 10B includes two pulse generation circuits 11, a plurality of variable capacitance circuits 12, and two ring oscillators 13. One of the pulse generation circuits 11 converts the time difference between the edges of two signals IN1a and IN1b to a difference between the pulse widths of two pulse signals P1a and P1b, and outputs P1a and P1b. The other pulse generation circuit 11 converts the time difference between the edges of two signals IN2a and IN2b to a difference between the pulse widths of two pulse signals P2a and P2b, and outputs P2a and P2b. Any one of P1a, P1b, P2a or P2b is input to each of the variable capacitance circuits 12. The capacitance value of each variable capacitance circuit 12 changes in accordance with the logic level of the input pulse signal.

In one of the ring oscillators 13, the output node of each delay element 131 is coupled to one of the variable capacitance circuits 12 receiving P1a, and one of the variable capacitance circuits 12 receiving P2a. In the other ring oscillator 13, the output nodes of each delay element 131 is coupled to one of the variable capacitance circuits 12 receiving P1b, and one of the variable capacitance circuits 12 receiving P2b. OUTa and OUTb are output from preferred ones of the delay elements 131 of the one and the other one of the ring oscillators 13, respectively.

The oscillation frequency of the ring oscillator 13 changes in accordance with the total capacitance value of the two variable capacitance circuits 12 coupled to the output nodes of the delay elements 131. Specifically, when the two variable capacitance circuits 12 have both high capacitance values, the load of the ring oscillator 13 is the maximum, and thus the oscillation frequency is the minimum. When the two variable capacitance circuits 12 have both low capacitance values, the load of the ring oscillator 13 is the minimum, and thus the oscillation frequency is the maximum. When one of the two variable capacitance circuits 12 has a low capacitance value and the other has a high capacitance value, the load of the ring oscillator 13 has the intermediary value, and thus the oscillation frequency has the intermediary value. As such, the oscillation frequency of one of the ring oscillators 13 changes with the total control amount of P1a and P2a, and the oscillation frequency of the other ring oscillator 13 changes with the total control amount of P1b and P2b. The time difference between the rising edges of IN1a and IN1b and the time difference between the rising edges of IN2a and IN2b are summed for integration.

As described above, this embodiment sums the time axis information represented by the phase difference between the two input signals IN1a and IN1b and the time axis information represented by the phase difference between the two input signals IN2a and IN2b for integration. With additional pulse generation circuits 11 and variable capacitance circuits 12, the number of inputs increases.

Third Embodiment

Figure 6:
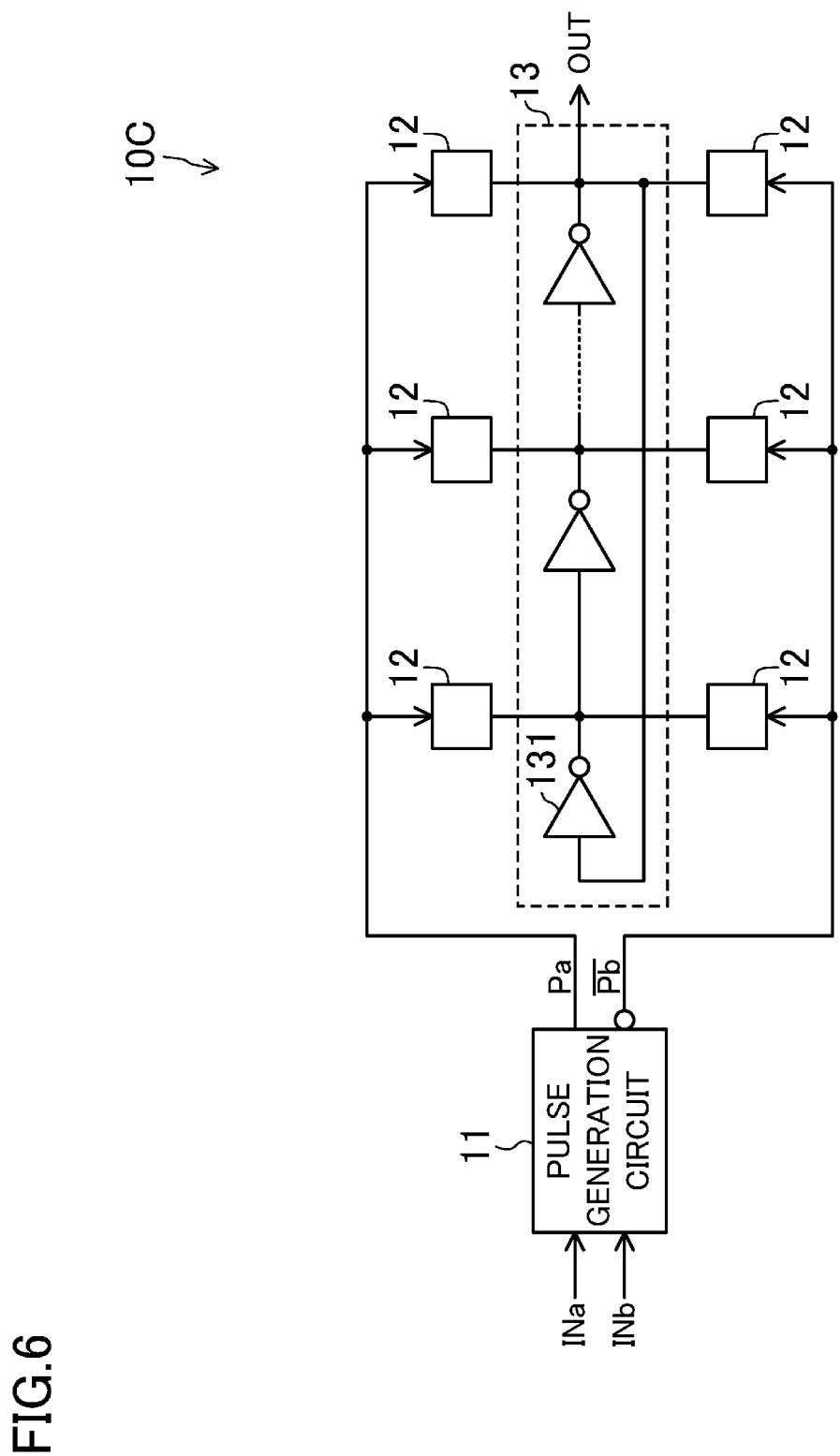
FIG. 6 is a configuration diagram of a time integrator according to a third embodiment.

FIG. 6 illustrates the configuration of a time integrator according to a third embodiment. A time integrator 10C according to this embodiment corresponds to the time integrator 10A according to the first embodiment, but outputs a single end signal. Differences from the first embodiment will be particularly described below.

The time integrator 10C integrates time axis information represented by the phase difference between two signals INa and INb, and output a signal OUT. The phase difference between OUT and a sampling clock signal (not shown) represents a result of time integration.

The time integrator 10C includes a pulse generation circuit 11, a plurality of variable capacitance circuits 12, and a ring oscillator 13. The pulse generation circuit 11 converts the time difference between the edges of INa and INb to the difference between the pulse widths of two pulse signals Pa and /Pb, and outputs Pa and /Pb. Pa has positive pulses, and /Pb has negative pulses. That is, /Pb is logic inversion of the pulse signal Pb output from the pulse generation circuit 11 of the time integrator 10A according to the first embodiment. Pa or /Pb is input to each of the variable capacitance circuits 12. The capacitance value of each variable capacitance circuit 12 varies in accordance with the logic level of the input pulse signal.

In the time integrator 10C, the ring oscillator 13 corresponds to an oscillation circuit with an oscillation frequency changing in accordance with the load characteristics of the load circuit, which is formed by the plurality of variable capacitance circuits 12. In the ring oscillator 13, the output node of each delay element 131 is coupled to one of the variable capacitance circuits 12 receiving Pa, and one of the variable capacitance circuits 12 receiving /Pb. OUT is output from preferred one of the delay elements 131 of the ring oscillator 13.

The oscillation frequency of the ring oscillator 13 changes in accordance with the total capacitance value of the two variable capacitance circuits 12 coupled to the output nodes of the delay elements 131. Specifically, when one of the two variable capacitance circuits 12 has a low capacitance value and the other has a high capacitance value, the load of the ring oscillator 13 has the intermediary value, and thus the oscillation frequency also has the intermediary value, that is, a regular frequency. When the two variable capacitance circuits 12 have both high capacitance values, the load of the ring oscillator 13 is the maximum, and thus the oscillation frequency is lower than the regular frequency. When the two variable capacitance circuits 12 have both low capacitance values, the load of the ring oscillator 13 is the minimum, and thus the oscillation frequency is higher than the regular frequency.

If there is no phase difference between INa and INb, Pa and /Pb have the same pulse width. That is, Pa and /Pb have opposite polarities to each other. Thus, if the variable capacitance circuits 12 receiving Pa have high capacitance values, the variable capacitance circuits 12 receiving /Pb have low capacitance values, or the variable capacitance circuits 12 receiving Pa have low capacitance values, the variable capacitance circuits 12 receiving /Pb have high capacitance values, and thus the oscillation frequency of the ring oscillator 13 is equal to the regular frequency. On the other hand, there is a phase difference between INa and INb, the pulse widths of Pa and /Pb are different. In the period corresponding to the difference between the pulse widths, the oscillation frequency of the ring oscillator 13 is not equal to the regular frequency. Whether the oscillation frequency of the ring oscillator 13 is higher or lower than the regular frequency depends on the polarity of the phase difference between INa and INb.

If the frequency of the sampling clock signal is equal to the regular frequency of the ring oscillator 13, the time difference between the rising edges of INa and INb is retained as the phase difference between OUT and the sampling clock signal. Therefore, a result of integration of the time difference between the rising edges of INa and INb is known from the phase difference between OUT and the sampling clock signal. That is, OUT represents the result of integration of the time difference between the rising edges of INa and INb.

As described above, this embodiment integrates the time axis information represented by the phase difference between the two input signals INa and INb, and represents the result of integration using the single signal OUT.

Fourth Embodiment

Figure 7:
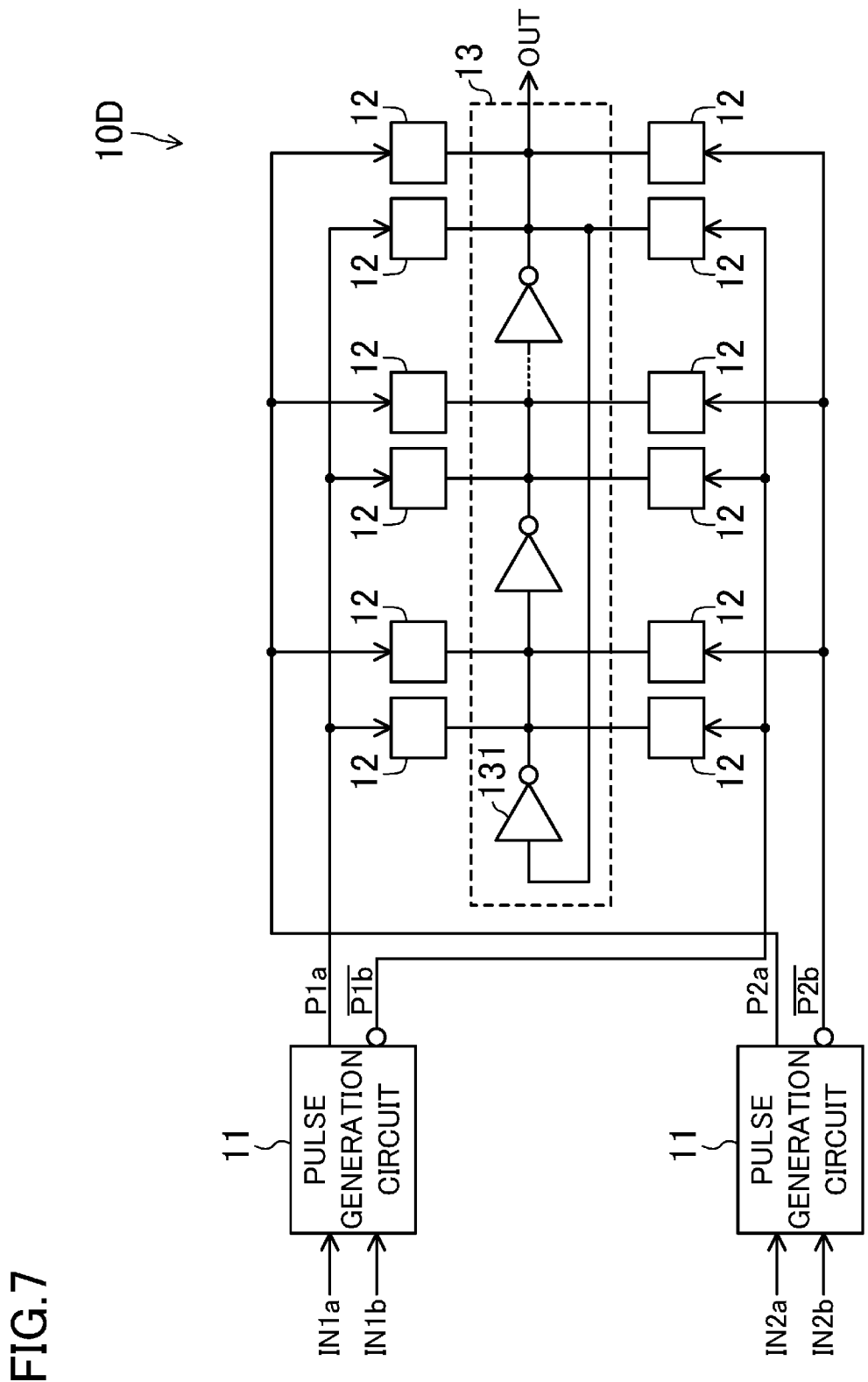
FIG. 7 is a configuration diagram of a time integrator according to a fourth embodiment.

FIG. 7 illustrates the configuration of a time integrator according to a fourth embodiment. A time integrator 10D according to this embodiment corresponds to the time integrator 10C according to the third embodiment, but has multiple inputs. Differences from the third embodiment will be particularly described below.

The time integrator 10D includes two pulse generation circuits 11, a plurality of variable capacitance circuits 12, and a ring oscillator 13. One of the pulse generation circuits 11 converts the time difference between the edges of two signals IN1a and IN1b to the difference between the pulse widths of two pulse signals P1a and /P1b, and outputs P1a and /P1b. The other pulse generation circuit 11 converts the time difference between the edges of two signals IN2a and IN2b to the difference between the pulse widths of two pulse signals P2a and /P2b, and outputs P2a and /P2b. Any one of P1a, /P1b, P2a, or /P2b is input to each one of the variable capacitance circuits 12. The capacitance value of each variable capacitance circuit 12 changes in accordance with the logic level of the input pulse signal.

In the ring oscillator 13, the output node of each delay element 131 is coupled to one of the variable capacitance circuits 12 receiving P1a, one of the variable capacitance circuits 12 receiving /P1b, one of the variable capacitance circuits 12 receiving P2a, and one of the variable capacitance circuits 12 receiving /P2b. OUT is output from preferred one of the delay elements 131 of the ring oscillator 13.

The oscillation frequency of the ring oscillator 13 changes in accordance with the total capacitance value of the four variable capacitance circuits 12 coupled to the output nodes of the delay elements 131. The load of the ring oscillator 13 changes in five stages in accordance with how many of the four variable capacitance circuits 12 has a high or low capacitance value. Accordingly, the oscillation frequency of the ring oscillator 13 changes in five stages. Specifically, when all of the four variable capacitance circuits 12 have high capacitance values, the load of the ring oscillator 13 is the maximum, and thus the oscillation frequency is the minimum. When all of the four variable capacitance circuits 12 have low capacitance values, the load of the ring oscillator 13 is the minimum, and thus the oscillation frequency is the maximum. When any two of the four variable capacitance circuits 12 have high capacitance values, and the other two have low capacitance values, the oscillation frequency of the ring oscillator 13 is equal to the regular frequency. As such, the oscillation frequency of the ring oscillator 13 changes with the total control amount of P1a, /P1b, P2a, and /P2b. That is, the time difference between the rising edges of IN1a and IN1b and the time difference between the rising edges of IN2a and IN2b are summed for integration.

As described above, this embodiment sums the time axis information represented by the phase difference between the two input signals IN1a and IN1b and the time axis information represented by the phase difference between the two input signals IN2a and IN2b for integration, and represents the result of integration using the single signal OUT. With additional pulse generation circuits 11 and variable capacitance circuits 12, the number of inputs increases.

Fifth Embodiment

Figure 8:
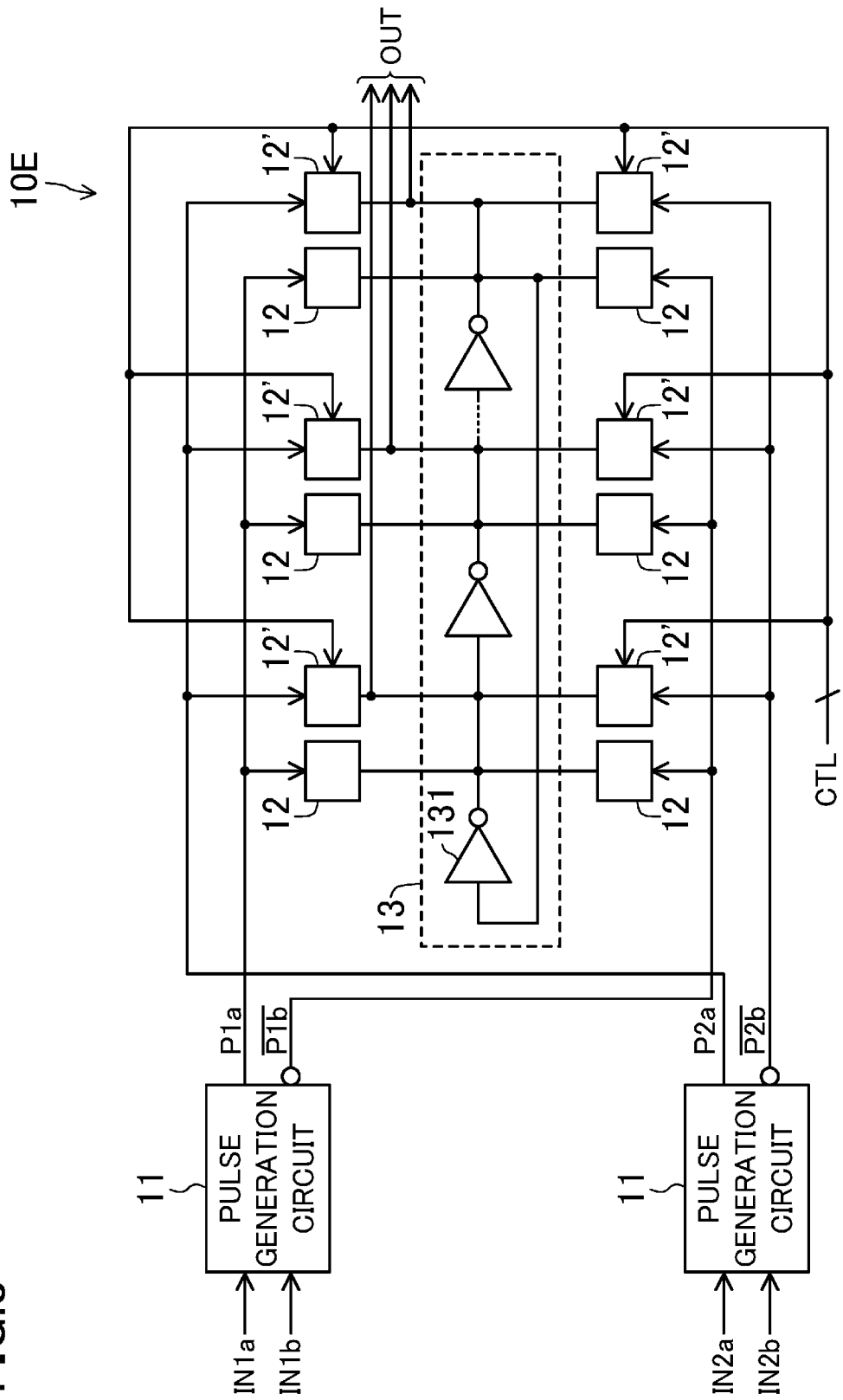
FIG. 8 is a configuration diagram of a time integrator according to a fifth embodiment.

FIG. 8 illustrates the configuration of a time integrator according to a fifth embodiment. A time integrator 10E according to this embodiment corresponds to the time integrator 10D according to the fourth embodiment, but an output has multi bits, and a specific input signal has a variable time integration gain. Differences from the fourth embodiment will be particularly described below.

The time integrator 10E includes two pulse generation circuits 11, a plurality of variable capacitance circuits 12, a plurality of variable capacitance circuits 12', and a ring oscillator 13. Any one of P1a or /P1b is input to each of the variable capacitance circuits 12. The capacitance value of each variable capacitance circuit 12 varies in accordance with the logic level of the input pulse signal. Any one of P2a or /P2b is input to each one of the variable capacitance circuits 12'. The capacitance value of each variable capacitance circuit 12' varies in accordance with the logic level of the input pulse signal. The capacitance value of each variable capacitance circuit 12' is controllable with a multi-bit control signal CTL.

Figure 9:
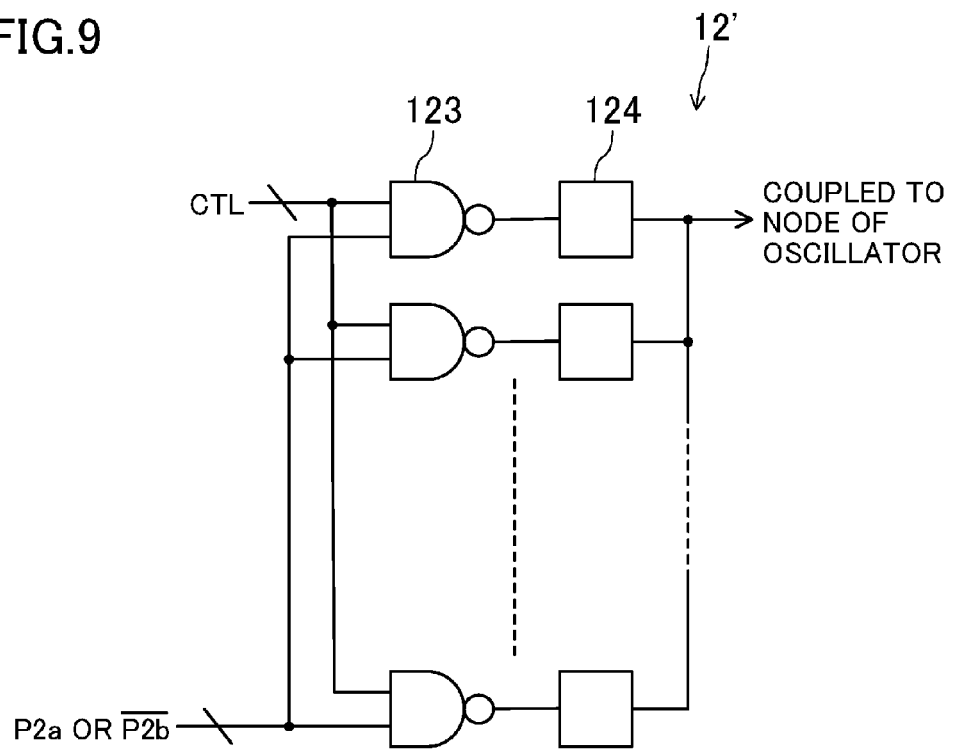
FIG. 9 is a configuration diagram of another example variable capacitance circuit.

FIG. 9 illustrates an example configuration of each variable capacitance circuit 12'. The variable capacitance circuit 12' includes, for example, a plurality of NAND gates 123 and a plurality of variable capacitance circuits 124. Each NAND gate 123 receives one of the bits of CTL and P2a or /P2b as a control signal. The outputs of the NAND gates 123 are coupled to the respective variable capacitance circuits 124. The output of each NAND gate 123 changes the capacitance value of the corresponding one of the variable capacitance circuits 124. The outputs of the variable capacitance circuits 124 are coupled to a predetermined node of the ring oscillator 13. The variable capacitance circuits 124 may be, for example, the variable capacitance circuits 12 shown in FIG. 4.

In the variable capacitance circuit 12' with the above-described configuration, the number of the variable capacitance circuits 124 having the capacitance changeable with the control signal depends on the value of CTL. That is, the capacitance value of each variable capacitance circuit 12' varies with CTL. As a result, the integration gain of time axis information represented by the phase difference between IN2a and IN2b changes.

Referring back to FIG. 8, in the ring oscillator 13, the output node of each delay element 131 is coupled to one of the variable capacitance circuits 12 receiving P1a, one of the variable capacitance circuits 12 receiving /P1b, one of the variable capacitance circuits 12' receiving P2a, and one of the variable capacitance circuits 12' receiving /P2b. OUT is output from the delay elements 131 of the ring oscillator 13. Specifically, OUT is a multi-bit signal formed by the outputs of the delay elements 131 forming the ring oscillator 13.

As described above, this embodiment outputs the multi-bit signal as a result of time integration, and controls the time integration gain of the specific input signal.

Sixth Embodiment

Figure 10:
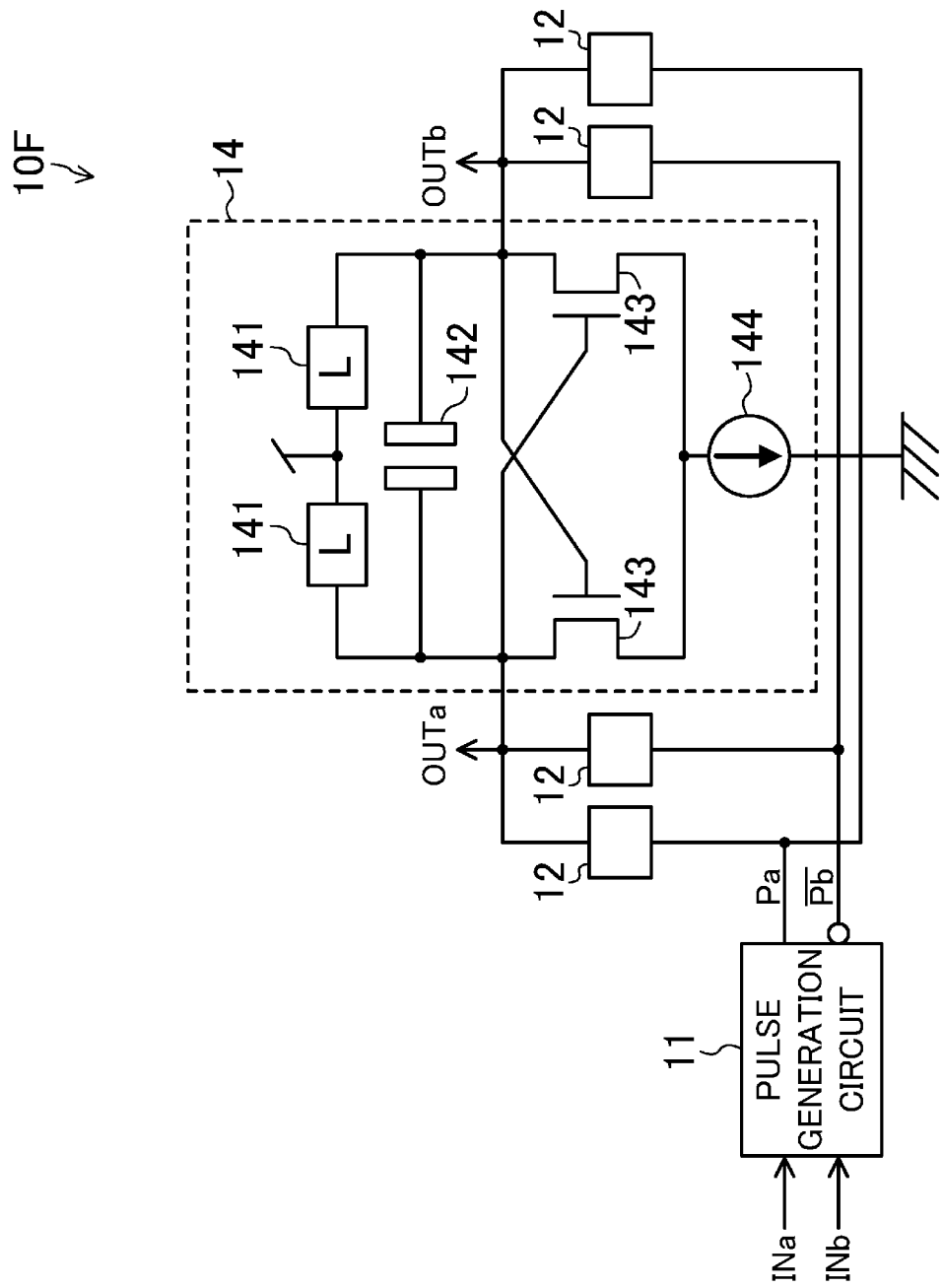
FIG. 10 is a configuration diagram of a time integrator according to a sixth embodiment.

FIG. 10 illustrates the configuration of a time integrator according to a sixth embodiment. A time integrator 10F according to this embodiment corresponds to the time integrator 10C according to the third embodiment, but the ring oscillator 13 is replaced with an LC oscillator 14. Differences from the third embodiment will be particularly described below.

The time integrator 10F includes a pulse generation circuit 11, a plurality of variable capacitance circuits 12, and the LC oscillator 14. The LC oscillator 14 corresponds to an oscillation circuit with an oscillation frequency changing in accordance with the load characteristics of the load circuit, which is formed by the plurality of variable capacitance circuits 12 in the time integrator 10F. The LC oscillator 14 may include, for example, two inductance elements 141, a capacitive element 142, two cross-coupled NMOS transistors 143, and a bias current source 144.

In the LC oscillator 14, the drain of one or the other of the transistors 143 is coupled to one of the variable capacitance circuits 12 receiving Pa, and one of the variable capacitance circuits 12 receiving /Pb. OUTa and OUTb are output from the drains of the one and the other of the transistors 143 of the LC oscillator 14, respectively.

Even if an LC oscillator is used as an oscillation circuit forming a time integrator as in this embodiment, time axis information is integrated. The time integrator 10F according to this embodiment is easily modified as appropriate to have multiple inputs or output a multi-bit signal.

Some embodiments of the time integrator have been described above. In each of above-described embodiments, the time difference between the rising edges of the two signals is regarded as the phase difference between the two signals. However, the time difference between the falling edges of the two signals, or the time difference between the rising and falling edges may be regarded as the phase difference between the two signals. While the two pulse signals have both positive pulses, two pulse signals may have both negative pulses, or one of the pulse signals may have positive pulses and the other may have negative pulses. The polarity of the signals may be changed by modifying the configurations of the pulse generation circuit 11 and the variable capacitance circuits 12 and 12' as appropriate.

ΔΣ Time-to-Digital Converter

Figure 11:
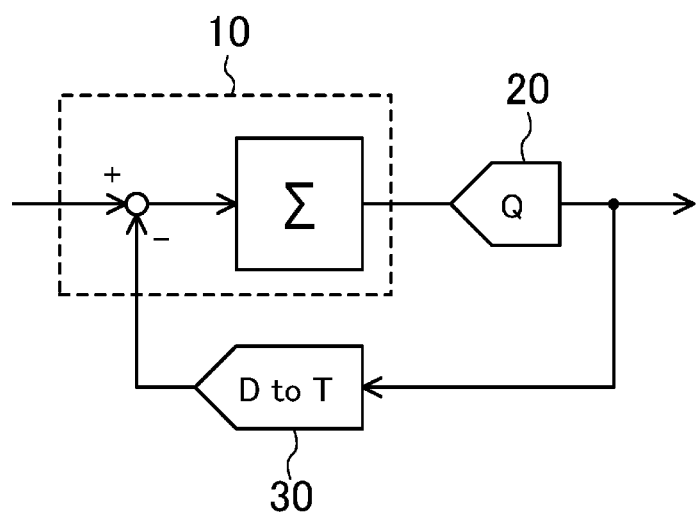
FIG. 11 is a representative configuration diagram of ΔΣ time-to-digital converters.

A ΔΣ time-to-digital converter is formed by using a time integrator. FIG. 11 is a representative configuration of ΔΣ time-to-digital converters. In general, each ΔΣ time-to-digital converter may include a time integrator 10 integrating the differential between an input signal and a feedback signal, a time quantizer 20 quantizing the output of the time integrator 10, and a digital-to-time converter 30 converting the output of the time quantizer 20 to time axis information and generating the feedback signal. Different from general ΔΣ A/D converters, the ΔΣ time-to-digital converter according to the present disclosure processes analog signals indicating time axis information represented by the phase difference between two signals. That is, the input and output signals of the time integrator 10, the input signal of the time quantizer 20, and the output signal of the digital-to-time converter 30 indicate the time axis information represented by the phase difference between the two signals. Some embodiments of the ΔΣ time-to-digital converter will be described below.

Seventh Embodiment

Figure 12:
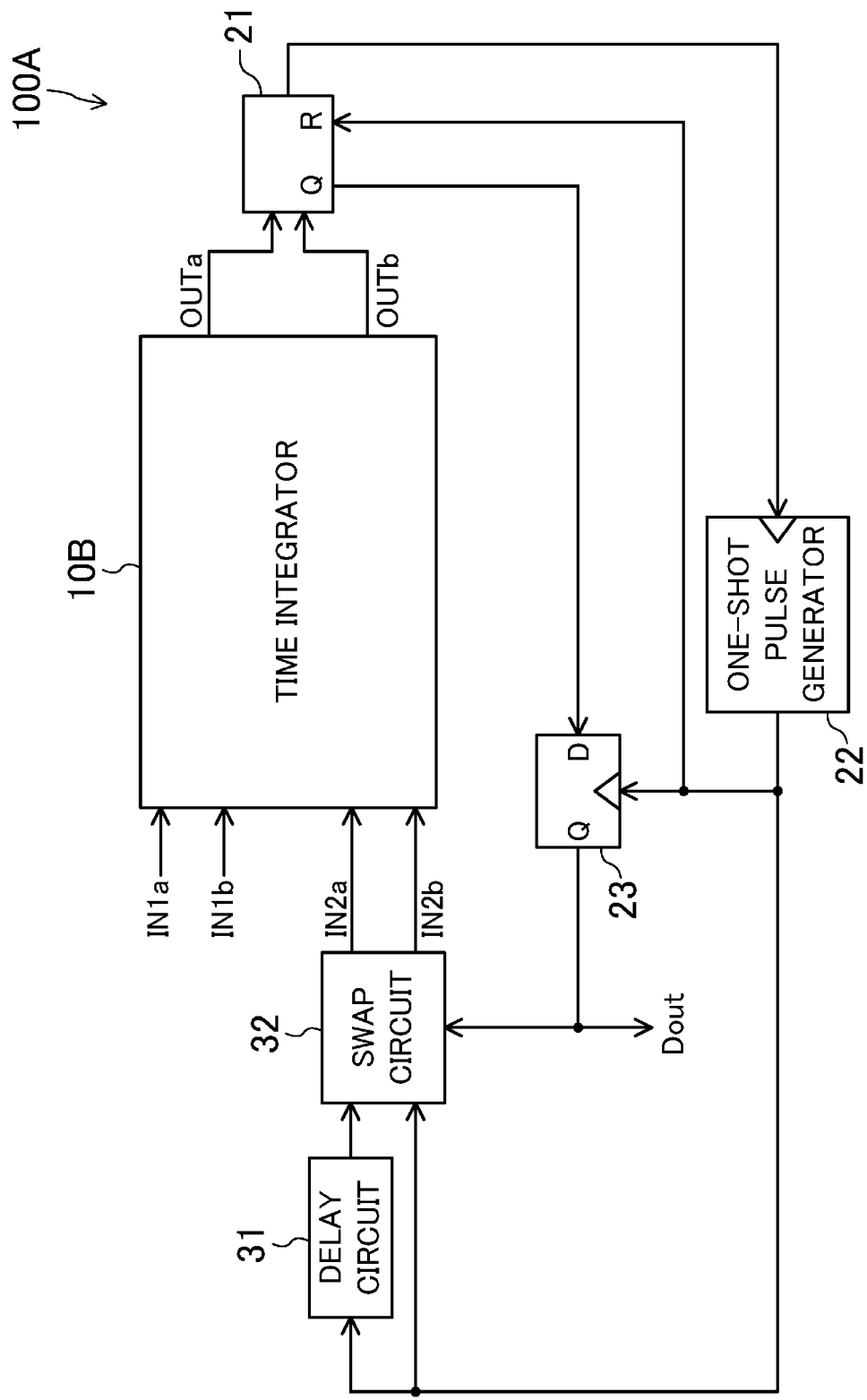
FIG. 12 is a configuration diagram of a ΔΣ time-to-digital converter according to a seventh embodiment.

FIG. 12 illustrates the configuration of a ΔΣ time-to-digital converter according to a seventh embodiment. A ΔΣ time-to-digital converter 100A according to this embodiment converts time axis information represented by the phase difference between two signals IN1a and IN1b to a digital value, and outputs a 1-bit signal Dout.

The ΔΣ time-to-digital converter 100A includes the time integrator 10B according to the second embodiment, a phase comparator 21, a one-shot pulse generator 22, a latch circuit 23, a delay circuit 31, and a swap circuit 32.

The circuitry portion including the phase comparator 21, the one-shot pulse generator 22, and the latch circuit 23 corresponds to the time quantizer 20 of FIG. 11. The phase comparator 21 compares the phases of OUTa and OUTb output from the time integrator 10B, and outputs a 1-bit value corresponding to the phase difference. The one-shot pulse generator 22 receives a phase comparison end signal indicating settlement of the phase comparison from the phase comparator 21, and generates a one-shot pulse. The latch circuit 23 latches the output of the phase comparator 21 at the timing of the one-shot pulse. The output of the latch circuit 23 corresponds to Dout. The phase comparator 21 is reset by the one-shot pulse.

The circuitry portion including the delay circuit 31 and the swap circuit 32 corresponds to the digital-to-time converter 30 of FIG. 11. The delay circuit 31 delays and outputs the one-shot pulse. The one-shot pulse and the one-shot pulse delayed and output by the delay circuit 31 are input to the swap circuit 32. The swap circuit 32 interchanges the input pulses in accordance with the output of the latch circuit 23, and outputs IN2a and IN2b. At this time, the pulses are interchanged such that the phase difference between OUTa and OUTb is fed back negative to the time integrator 10B.

Figure 13:
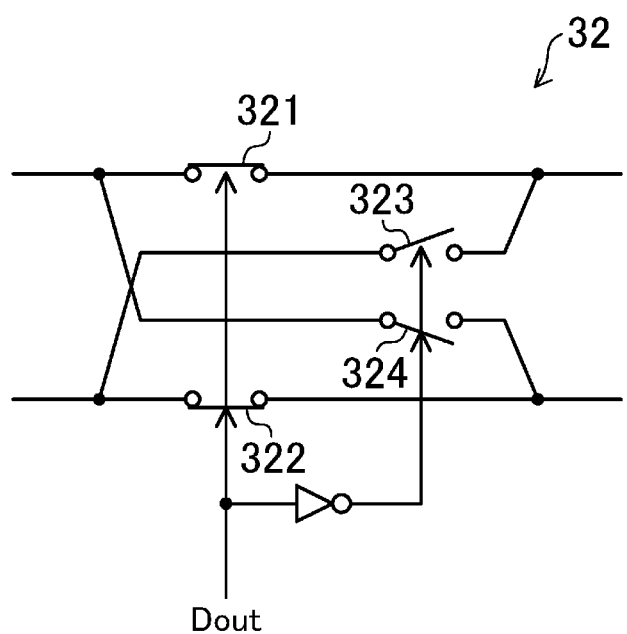
FIG. 13 is a configuration diagram of an example swap circuit.

FIG. 13 illustrates an example configuration of the swap circuit 32. The swap circuit 32 may include, for example, four switching elements 321, 322, 323, and 324.

As described above, this embodiment provides the configuration similar to those of usual ΔΣ A/D converters as viewed at a signal block level, but the processed signals indicate the time axis information. Therefore, the ΔΣ A/D converter of this embodiment operates as a ΔΣ A/D converter handing the time axis information.

Eighth Embodiment

Figure 14:
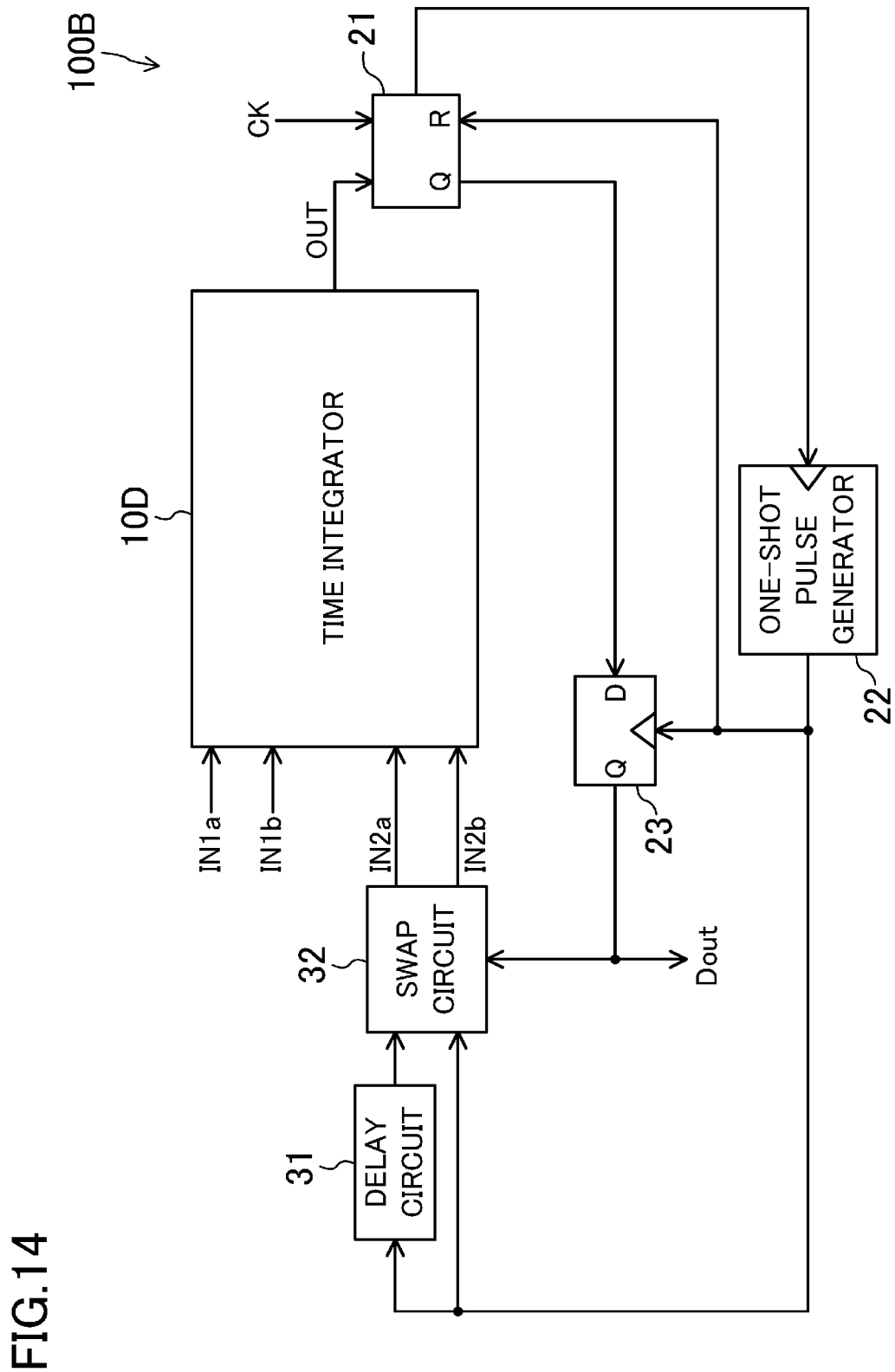
FIG. 14 is a configuration diagram of a ΔΣ time-to-digital converter according to an eighth embodiment

FIG. 14 illustrates the configuration of a ΔΣ time-to-digital converter according to an eighth embodiment. A ΔΣ time-to-digital converter 100B according to this embodiment corresponds to the ΔΣ time-to-digital converter 100A according to the seventh embodiment, but the time integrator 10B is replaced with the time integrator 10D according to the fourth embodiment. Different from the seventh embodiment, OUT output from the time integrator 10D, and a sampling clock signal CK with a frequency equal to the regular frequency of the ring oscillator 13 of the time integrator 10D are input to the phase comparator 21. As in this embodiment, a ΔΣ time-to-digital converter may be formed using the time integrator 10D which outputs a single end signal as a result of time integration.

Ninth Embodiment

Figure 15:
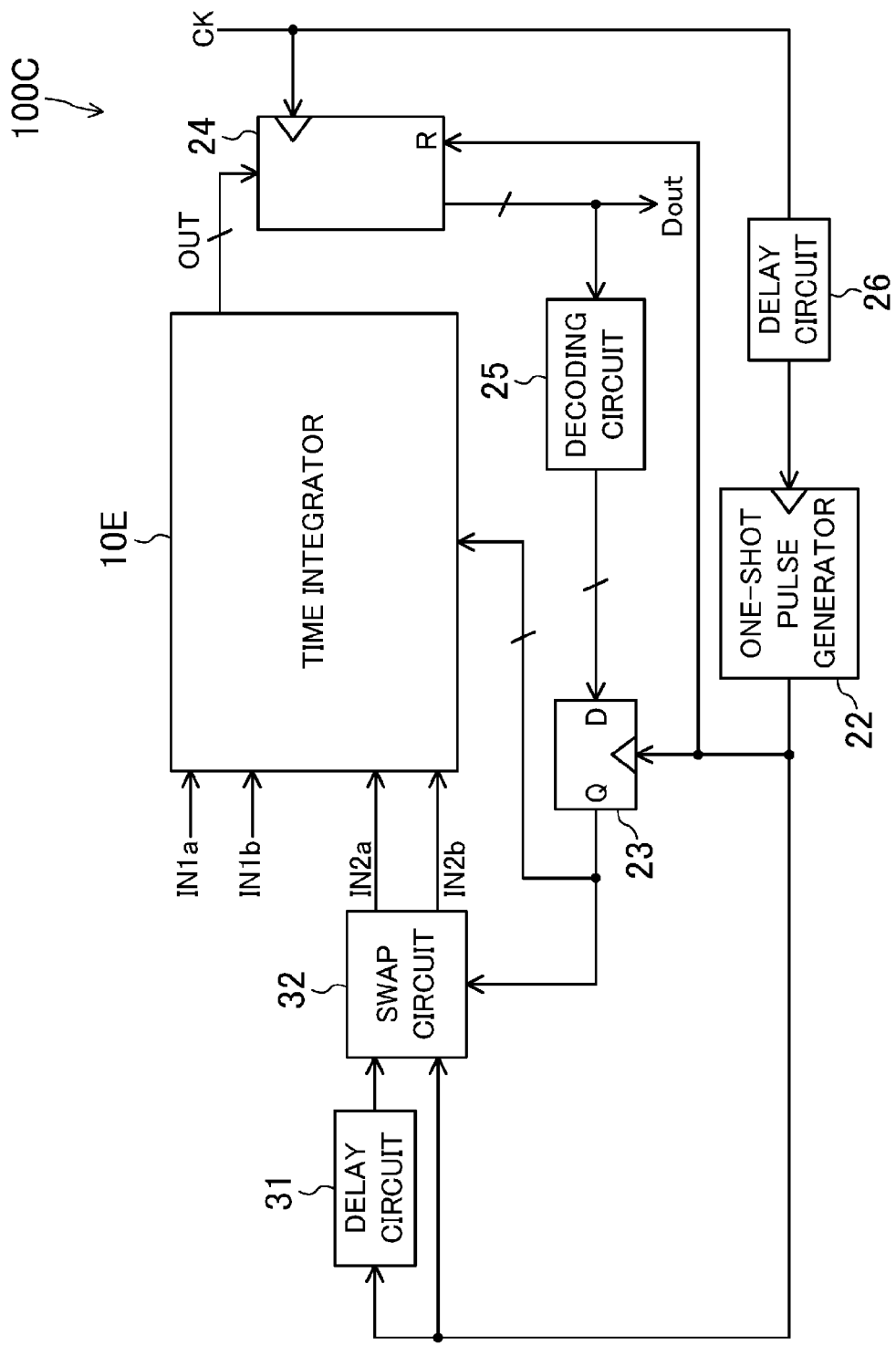
FIG. 15 is a configuration diagram of a ΔΣ time-to-digital converter according to a ninth embodiment.

FIG. 15 illustrates the configuration of a ΔΣ time-to-digital converter according to a ninth embodiment. A ΔΣ time-to-digital converter 100C according to this embodiment converts time axis information represented by the phase difference between two signals IN1a and IN1b to a digital value, and outputs a multi-bit signal Dout. The ΔΣ time-to-digital converter 100C corresponds to the ΔΣ time-to-digital converter 100A according to the seventh embodiment, but the time integrator 10B is replaced with the time integrator 10E according to the fifth embodiment. Differences from the seventh embodiment will be particularly described below.

The ΔΣ time-to-digital converter 100C includes the time integrator 10E according to the fifth embodiment, a one-shot pulse generator 22, a latch circuit 23, a phase state detection circuit 24, a decoding circuit 25, a delay circuit 26, a delay circuit 31, and a swap circuit 32.

The circuitry portion including the one-shot pulse generator 22, the latch circuit 23, the phase state detection circuit 24, the decoding circuit 25, and the delay circuit 26 corresponds to the time quantizer 20 of FIG. 11. The phase state detection circuit 24 latches OUT output from the time integrator 10E at timing of a sampling clock signal CK with a frequency equal to the regular frequency of the ring oscillator 13 of the time integrator 10E. OUT is a multi-bit signal formed by outputs of delay elements 131 forming the ring oscillator 13 of the time integrator 10E. The phase state detection circuit 24 detects the phase state of the ring oscillator 13 at the timing of CK. The multi-bit output of the phase state detection circuit 24 corresponds to Dout. The decoding circuit 25 decodes Dout and generates a multi-bit signal for negative feedback control of the time integrator 10E. The delay circuit 26 delays and outputs CK. The one-shot pulse generator 22 receives the output of the delay circuit 26, and generates a one-shot pulse. The phase state detection circuit 24 is reset by the one-shot pulse.

The latch circuit 23 latches the output of the decoding circuit 25 at the timing of the one-shot pulse. The multi-bit signal output from the latch circuit 23 is input to the time integrator 10E as a control signal changing the integration gain of the time axis information represented by the phase difference between IN2a and IN2b. MSB of the multi-bit signal output from the latch circuit 23 is input to the swap circuit 32 as a control signal. The phase difference between IN2a and IN2b is fixed by the delay amount of the delay circuit 31. By controlling the integration gain of the phase difference between IN2a and IN2b with the output of the latch circuit 23, the multi-bit output of the time quantizer 20 is substantially fed back negative to the time integrator 10E.

As described above, this embodiment provides the ΔΣ time-to-digital converter outputting the multi-bit signal.

Tenth Embodiment

Figure 16:
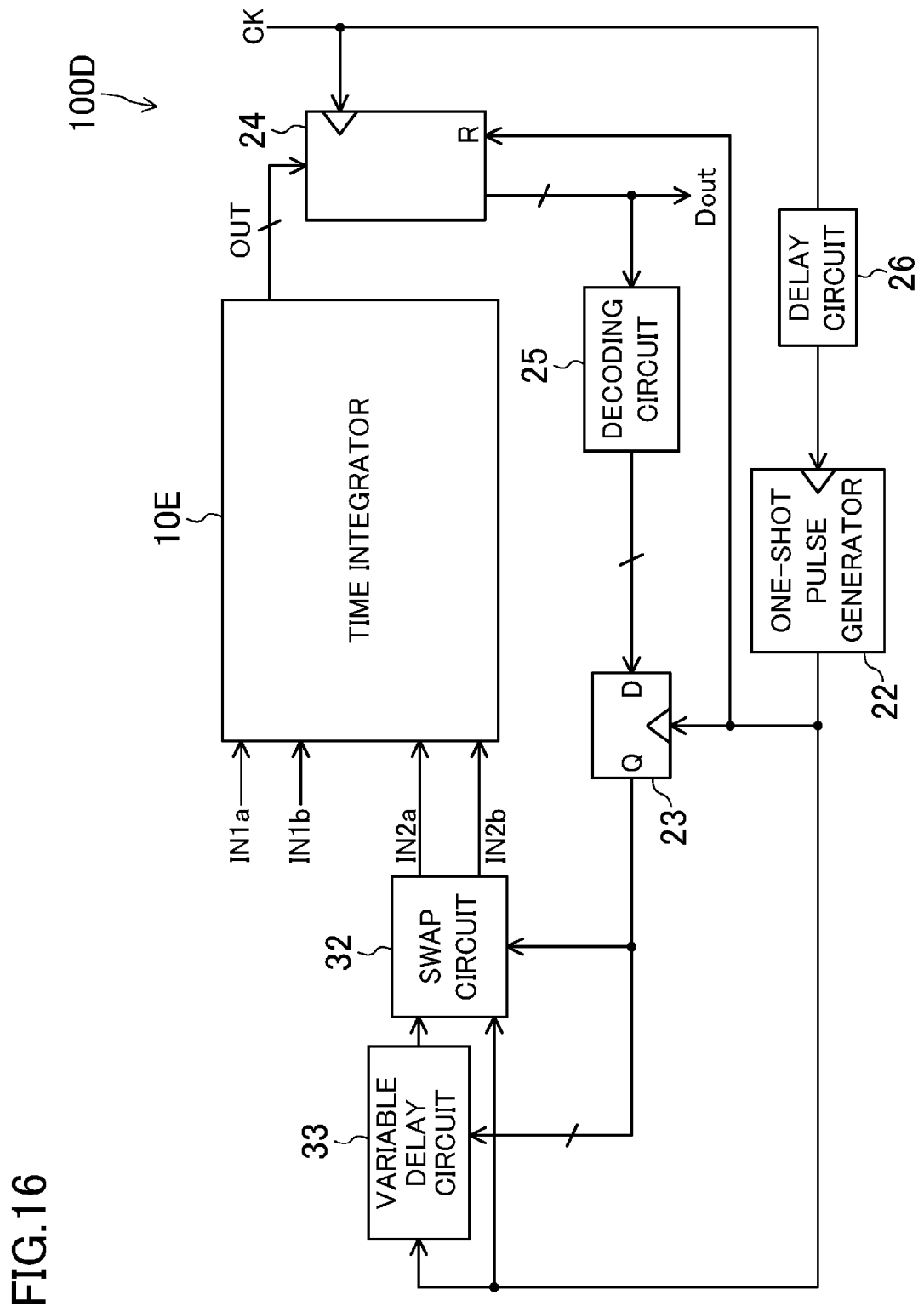
FIG. 16 is a configuration diagram of a ΔΣ time-to-digital converter according to a tenth embodiment.

FIG. 16 illustrates the configuration of a ΔΣ time-to-digital converter according to a tenth embodiment. A ΔΣ time-to-digital converter 100D according to this embodiment corresponds to the ΔΣ time-to-digital converter 100C according to the ninth embodiment, but the time integrator 10E does not control the integration gain of the phase difference between IN2a and IN2b. The phase difference between IN2a and IN2b itself changes in accordance with the multi-bit output of the time quantizer 20. Differences from the ninth embodiment will be particularly described below.

The ΔΣ time-to-digital converter 100D includes the time integrator 10E according to the fifth embodiment, a one-shot pulse generator 22, a latch circuit 23, a phase state detection circuit 24, a decoding circuit 25, a delay circuit 26, a swap circuit 32, and a variable delay circuit 33.

The circuitry portion including the swap circuit 32 and the variable delay circuit 33 corresponds to the digital-to-time converter 30 of FIG. 11. The variable delay circuit 33 delays an input one-shot pulse by the delay amount corresponding to the output of the latch circuit 23, and outputs the delayed pulse. The one-shot pulse and the one-shot pulse delayed and output by the variable delay circuit 33 are input to the swap circuit 32.

Figure 17:
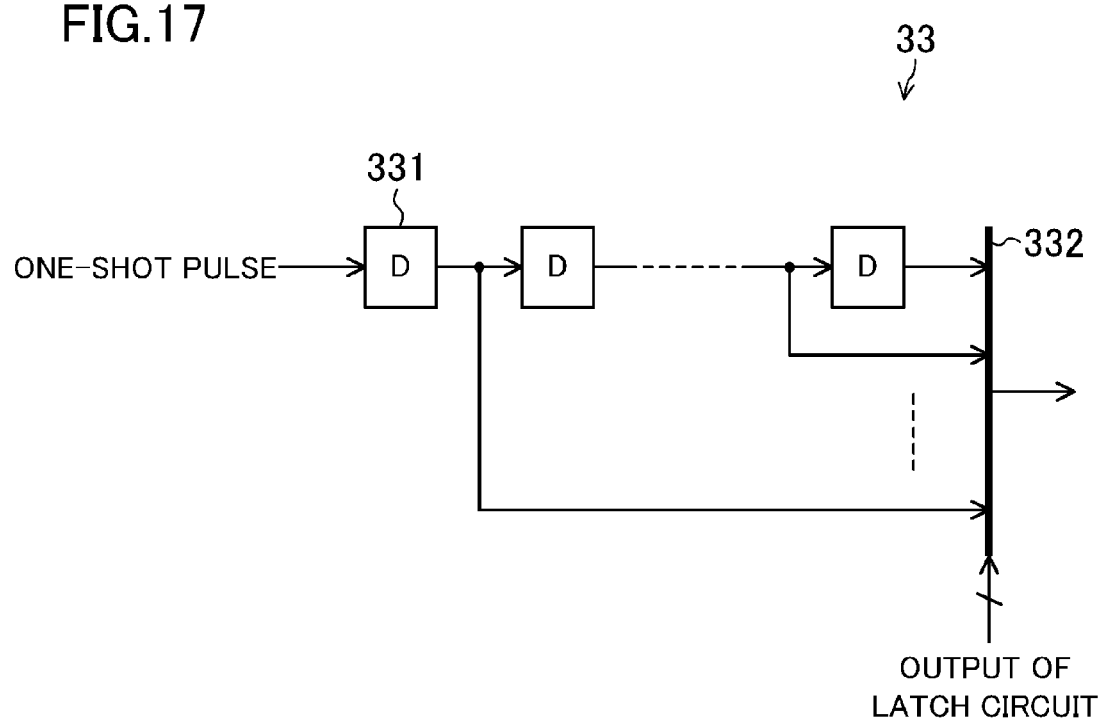
FIG. 17 is a configuration diagram of an example variable delay circuit.

FIG. 17 illustrates an example configuration of the variable delay circuit 33. The variable delay circuit 33 may include, for example, a plurality of cascade-coupled delay elements 331 and a selector circuit 332. The selector circuit 332 is coupled to the outputs of the delay elements 331. The selector circuit 332 outputs any one of the plurality of inputs in accordance with the output of the latch circuit 23. This changes the phase difference between IN2a and IN2b in accordance with the multi-bit output of the time quantizer 20.

As described above, this embodiment provides the ΔΣ time-to-digital converter outputting the multi-bit signal.

Eleventh Embodiment

Figure 18:
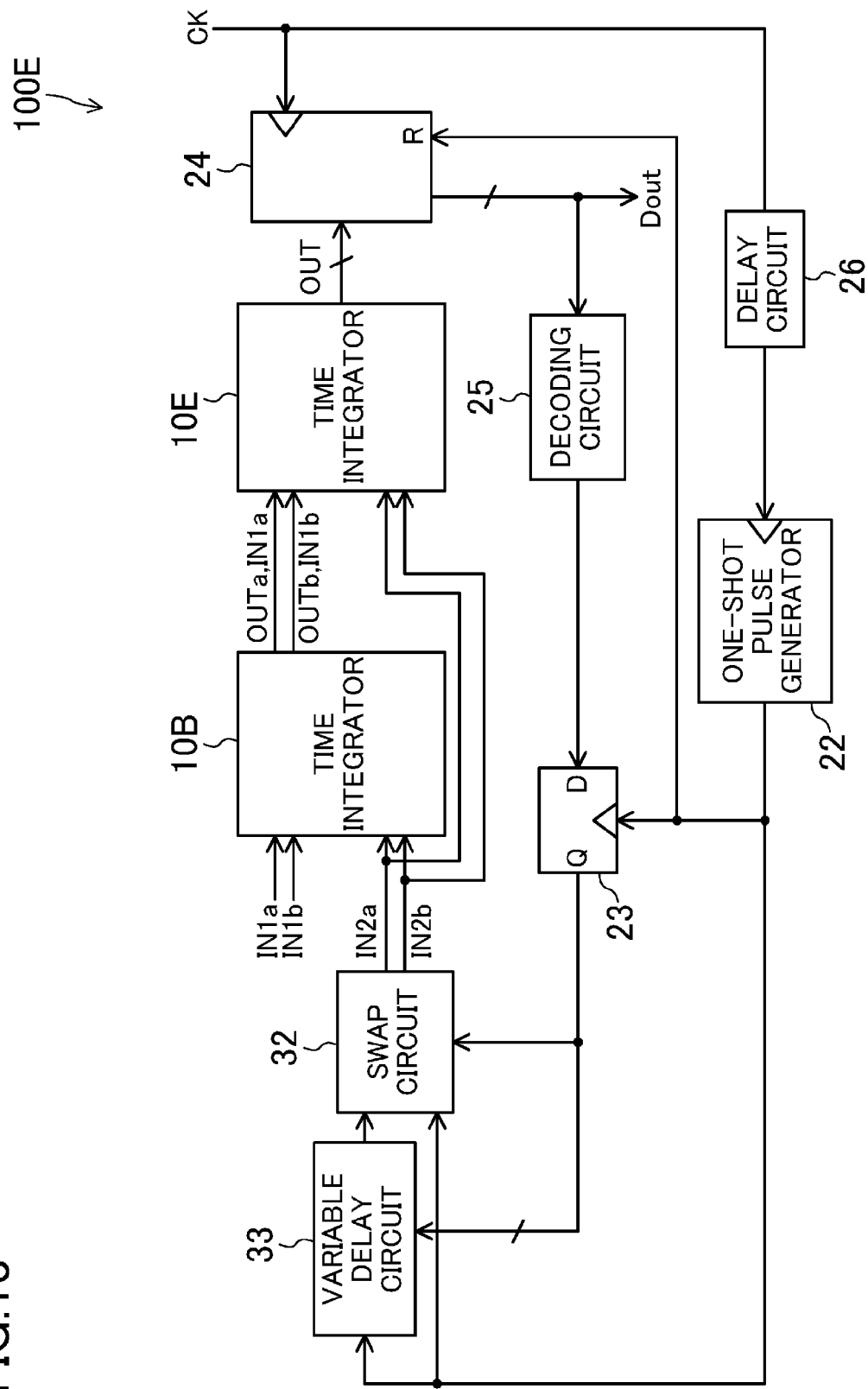
FIG. 18 is a configuration diagram of a ΔΣ time-to-digital converter according to an eleventh embodiment.

FIG. 18 illustrates the configuration of a ΔΣ time-to-digital converter according to an eleventh embodiment. A ΔΣ time-to-digital converter 100E according to this embodiment corresponds to the ΔΣ time-to-digital converter 100D according to the tenth embodiment, but additionally includes the time integrator 10B according to the second embodiment. Specifically, IN1a and IN1b input to the ΔΣ time-to-digital converter 100E are input to the time integrator 10B, and OUTa and OUTb output from the time integrator 10B are coupled to IN1a and IN1b of the time integrator 10E, respectively. The two signals output from a swap circuit 32 are input as IN2a and IN2b to the time integrators 10B and 10E. As such, since the time integrators 10B and 10E are cascade-coupled, the ΔΣ time-to-digital converter 100E has second-order time integration characteristics. This improves the accuracy in the time-to-digital conversion. Additional cascade-coupled time integrators may provide higher-order time integration characteristics.

Twelfth Embodiment

FIG. 19 illustrates the configuration of a ΔΣ time-to-digital converter according to a twelfth embodiment. A ΔΣ time-to-digital converter 100F according to this embodiment includes a time integrator 10 outputs two signals OUTa and OUTb as in the time integrator 10B according to the second embodiment, a time quantizer 20 quantizing the phase difference between OUTa and OUTb, a digital-to-time converter 30 converting the output of the time quantizer 20 to time axis information and feeding back the converted output negative to the time integrator 10, and two counter circuits 40, and a frequency control circuit 50.

OUTa and OUTb are input to the two counter circuits 40. Each counter circuit 40 counts the edge of an input signal for a predetermined period. The oscillation frequencies of two oscillators (not shown, e.g., the ring oscillators 13 shown in FIG. 5) of the time integrator 10 are known from the counted values.

In the time integrator 10 including two oscillators, the oscillation frequencies of the two oscillators need to be equal. Thus, the frequency control circuit 50 receives the count values from the two counter circuits 40, and controls the oscillation frequencies of the two oscillators of the time integrator 10 to be equal. The frequency control circuit 50 controls the oscillation frequencies of the oscillators, for example, by adjusting the load characteristics of a load circuit (not shown) in the time integrator 10. Specifically, the variable capacitance circuits 12' as shown in FIG. 9 are coupled to the oscillators to form the load circuit, and a control signal CTL is output from the frequency control circuit 50, thereby controlling the oscillation frequencies of the oscillators.

As described above, this embodiment stabilizes the oscillation frequencies of the oscillation circuits of the time integrator 10, thereby stabilizing the operation of the ΔΣ time-to-digital converter.

Thirteenth Embodiment

FIG. 20 illustrates the configuration of a ΔΣ time-to-digital converter according to a thirteenth embodiment. A ΔΣ time-to-digital converter 100G according to this embodiment corresponds to the ΔΣ time-to-digital converter 100F according to the twelfth embodiment, but the time integrator 10 is replaced with s time integrator 10 outputting a single end signal OUT like the time integrator 10D according to the fourth embodiment. Differences from the twelfth embodiment will be particularly described below.

A counter circuit 40 counts the edges of OUT output from the time integrator 10 for a predetermined period. A frequency control circuit 50 receives the value counted by the counter circuit 40 and a reference count value, and controls the oscillation frequency of an oscillator (not shown, e.g., the ring oscillator 13 shown in FIG. 7) of the time integrator 10 such that the value counted by the counter circuit 40 is equal to the reference count value. The reference count value corresponds to the regular frequency of the oscillator of the time integrator 10.

As in this embodiment, a ΔΣ time-to-digital converter including the time integrator 10 outputting the single end signal as a result of time integration stabilizes the oscillation frequency of the oscillation circuit of the time integrator 10, thereby stabilizing the operation of the ΔΣ time-to-digital converter.

Fourteenth Embodiment

Figure 21:
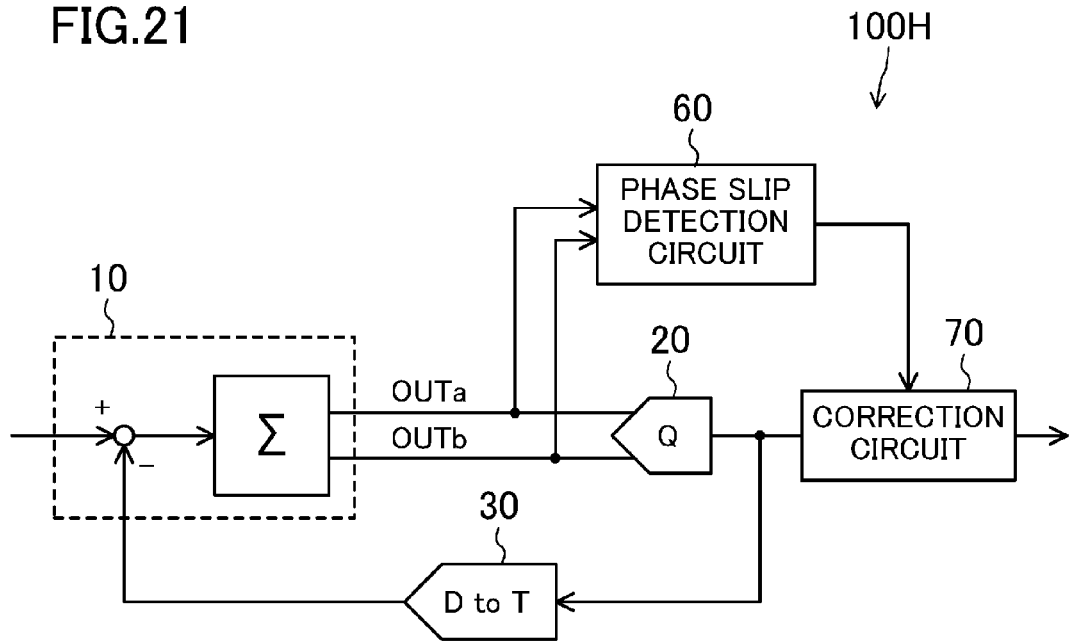
FIG. 21 is a configuration diagram of a ΔΣ time-to-digital converter according to a fourteenth embodiment.

FIG. 21 illustrates the configuration of a ΔΣ time-to-digital converter according to a fourteenth embodiment. A ΔΣ time-to-digital converter 100H according to this embodiment includes a time integrator 10 outputting two signals OUTa and OUTb as in the time integrator 10B according to the second embodiment, a time quantizer 20 quantizing the phase difference between OUTa and OUTb, a digital-to-time converter 30 converting the output of the time quantizer 20 to time axis information and feeding back the converted output negative to the time integrator 10, a phase slip detection circuit 60, and a correction circuit 70.

OUTa and OUTb are input to the phase slip detection circuit 60. The phase slip detection circuit 60 detects, from OUTa and OUTb, phase slip of an oscillation circuit (not shown) of the time integrator 10. When the oscillation frequencies of two oscillator (not shown, e.g., the ring oscillators 13 shown in FIG. 5) of the time integrator 10 are equal, the phase difference between OUTa and OUTb does not change. On the other hand, the oscillation frequencies of the two oscillators are different from each other, the phase difference between OUTa and OUTb gradually increases to cause a phase difference of one period, which corresponds to 2π, at a time point. The phase slip detection circuit 60 detects the phase difference corresponding to 2π as the phase slip.

Figure 22:
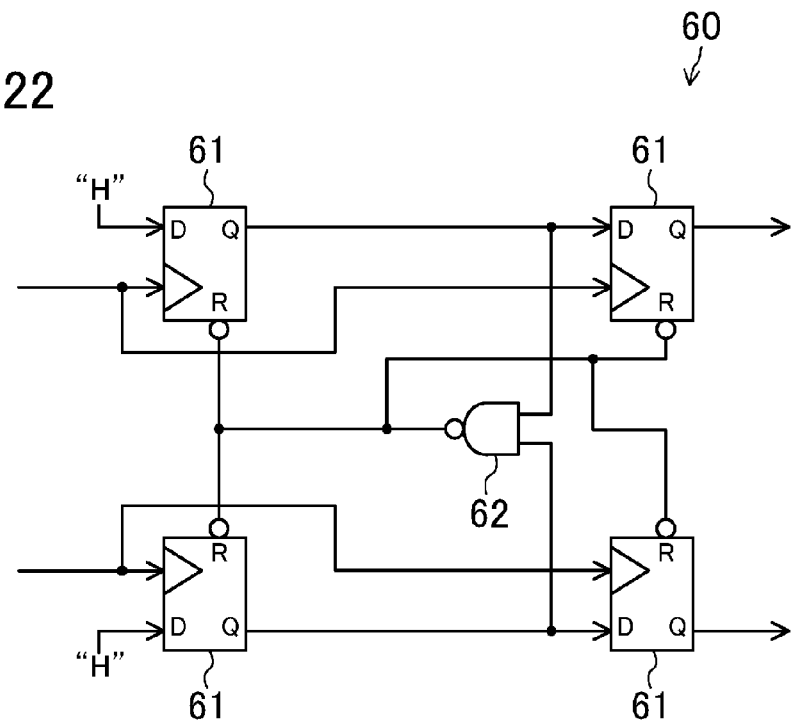
FIG. 22 is a configuration diagram of an example phase slip detection circuit.

FIG. 22 illustrates an example configuration of the phase slip detection circuit 60. The phase slip detection circuit 60 includes, for example, four DFFs 61 and a NAND gate 62. A logic level H is applied to the data inputs of the two preceding DFFs 61. INa and INb are input, as clocks, to the two preceding DFFs 61. The data inputs of the two subsequent DFFs 61 are coupled to Q outputs of the two preceding DFFs 61. The two subsequent DFFs 61 receive INa and INb as clocks, and outputs the Q outputs as slip detection signals. The Q outputs of the two preceding DFFs 61 are input to the NAND gate 62. The output of the NAND gate 62 is coupled to reset inputs of the DFFs 61.

Assume that the oscillation frequencies of two oscillators of the time integrator 10 are equal. Since a signal edge of OUTb necessarily occurs, for example, within one period from the occurrence of a signal edge of OUTa, the four DFFs 61 are reset before the next signal edge of OUTa occurs. Thus, the Q outputs of the two subsequent DFFs 61 never become the H level. On the other hand, assume that the oscillation frequencies of two oscillators of the time integrator 10 are different, and the phase difference between OUTa and OUTb is $2\pi$ or more. For example, after a signal edge of OUTa occurs, the next signal edge of OUTa occurs prior to a signal edge of OUTb. Thus, the Q outputs of the subsequent DFFs 61 receiving OUTa shift to the H level. As such, the phase slip detection circuit 60 with the above-described configuration detects the phase slip of the two oscillators of the time integrator 10.

Figure 23:
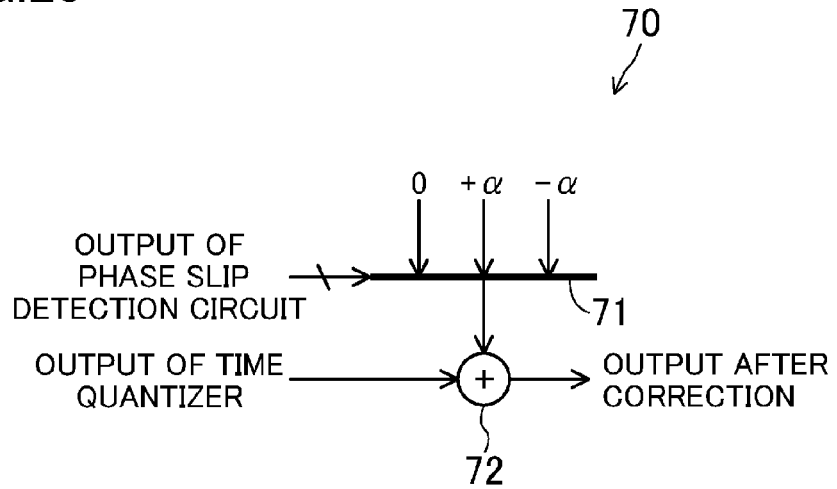
FIG. 23 is a configuration diagram of an example correction circuit.

Referring back to FIG. 21, the correction circuit 70 corrects a digital value output from the time quantizer 20 based on the output of the phase slip detection circuit 60. FIG. 23 illustrates an example configuration of the correction circuit 70. The correction circuit 70 may include, for example, a selector circuit 71 and an adder 72. Values 0, $+\alpha$, and $-\alpha$ are input to the selector circuit 71. The value $\alpha$ represents the phase difference corresponding to $2\pi$. The selector circuit 71 outputs any one of the input values indicated by a 2-bit signal output from the phase slip detection circuit 60. Specifically, the selector circuit 71 outputs 0 in detecting no phase slip, and outputs $+\alpha$ or $-\alpha$ in detecting phase slip. Whether $+\alpha$ or $-\alpha$ is output depends on the relative heights of the oscillation frequencies of the two oscillators of the time integrator 10.

As described above, this embodiment corrects an off-set error caused by the difference between the oscillation frequencies of the two oscillators of the time integrator 10, thereby improving the conversion accuracy of the $\Delta\Sigma$ time-to-digital converter.

Fifteenth Embodiment

Figure 24:
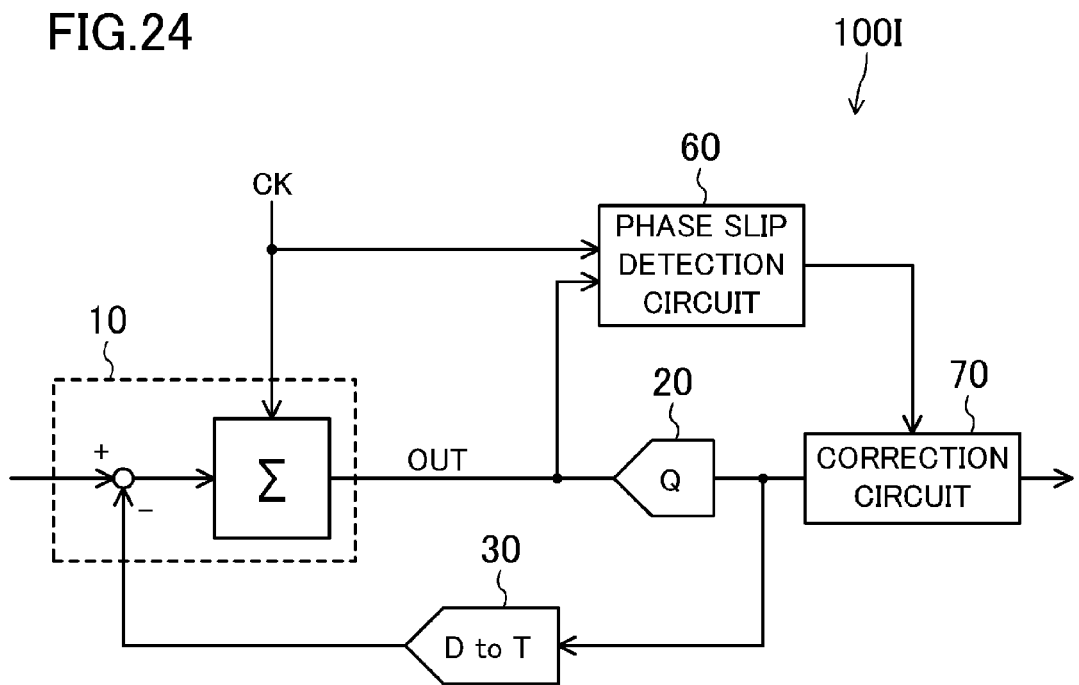
FIG. 24 is a configuration diagram of a ΔΣ time-to-digital converter according to a fifteenth embodiment.

FIG. 24 illustrates the configuration of a $\Delta\Sigma$ time-to-digital converter according to a fifteenth embodiment. A $\Delta\Sigma$ time-to-digital converter 100I according to this embodiment corresponds to the $\Delta\Sigma$ time-to-digital converter 100G according to the fourteenth embodiment, but the time integrator 10 is replaced with a time integrator 10 outputting a single end signal OUT like the time integrator 10D according to the fourth embodiment. Differences from the fourteenth embodiment will be particularly described below.

OUT and a sampling clock signal CK are input to a phase slip detection circuit 60. CK is a clock signal CK with a frequency equal to the regular frequency of a ring oscillator (not shown, e.g., the ring oscillator 13 shown in FIG. 7) of the time integrator 10, and is also input to the time integrator 10. The phase slip detection circuit 60 detects phase slip of an oscillation circuit (not shown) of the time integrator 10 from OUT and CK. The correction circuit 70 corrects a digital value output from the time quantizer 20 based on the output of the phase slip detection circuit 60.

As in this embodiment, a $\Delta\Sigma$ time-to-digital converter including the time integrator 10 outputting the single end signal as a result of time integration corrects an off-set error caused by the difference in the oscillation frequency of the oscillator of the time integrator 10, thereby improving the conversion accuracy of the $\Delta\Sigma$ time-to-digital converter.

As described above, the first to fifteenth embodiments have been described as example techniques disclosed in the present application. However, the techniques according to the present disclosure are not limited to these embodiments, but are also applicable to those where modifications, substitutions, additions, and omissions are made. In addition, elements described in the first to fifteenth embodiments may be combined to provide a different embodiment.

Various embodiments have been described above as example techniques of the present disclosure, in which the attached drawings and the detailed description are provided.

As such, elements illustrated in the attached drawings or the detailed description may include not only essential elements for solving the problem, but also non-essential elements for solving the problem in order to illustrate such techniques. Thus, the mere fact that those non-essential elements are shown in the attached drawings or the detailed description should not be interpreted as requiring that such elements be essential.

Since the embodiments described above are intended to illustrate the techniques in the present disclosure, it is intended by the following claims to claim any and all modifications, substitutions, additions, and omissions that fall within the proper scope of the claims appropriately interpreted in accordance with the doctrine of equivalents and other applicable judicial doctrines.

What is claimed is:

1. A time integrator integrating time axis information represented by a phase difference between two signals, the time integrator comprising:
    a pulse generation circuit configured to convert a time difference between edges of two input signals to a difference between pulse widths of two pulse signals, and to output the two pulse signals;
    a load circuit having load characteristics changed by the two pulse signals; and
    an oscillation circuit coupled to the load circuit, and having an oscillation frequency changing in accordance with the load characteristics of the load circuit,
    wherein an output of the oscillation circuit is output as a result of time integration,
    the load circuit includes a plurality of variable capacitance circuits, each being configured to receive one or the other of the two pulse signals, and having a capacitance value varying in accordance with a logic level of the received pulse signal, and
    the oscillation circuit includes:
        an oscillator coupled to one(s) of the variable capacitance circuits receiving the one of the two pulse signals, and having an oscillation frequency changing in accordance with a capacitance value(s) of the coupled variable capacitance circuit(s), and
        another oscillator coupled to another one(s) of the variable capacitance circuits receiving the other one of the two pulse signals, and having an oscillation frequency changing in accordance with a capacitance value(s) of the coupled variable capacitance circuit(s).

2. A time integrator integrating time axis information represented by a phase difference between two signals, the time integrator comprising:

a pulse generation circuit configured to convert a time difference between edges of two input signals to a difference between pulse widths of two pulse signals, and to output the two pulse signals;

a load circuit having load characteristics changed by the two pulse signals; and an oscillation circuit coupled to the load circuit, and having an oscillation frequency changing in accordance with the load characteristics of the load circuit, wherein an output of the oscillation circuit is output as a result of time integration, the pulse generation circuit includes another pulse generation circuit;

the load circuit includes another load circuit, another two signals are input to the another pulse generation circuit, each of the load circuits includes a plurality of variable capacitance circuits, each being configured to receive one or the other of the two pulse signals, and having a capacitance value varying in accordance with a logic level of the received pulse signal, and each of the oscillation circuits includes:
an oscillator coupled to one(s) of the variable capacitance circuits receiving the one of the two pulse signals, having an oscillation frequency changing in accordance with a capacitance value(s) of the coupled variable capacitance circuit(s), and another oscillator coupled to another one(s) of the variable capacitance circuits receiving the other one of the two pulse signals, and having an oscillation frequency changing in accordance with a capacitance value(s) of the coupled variable capacitance circuit(s).

3. A time integrator integrating time axis information represented by a phase difference between two signals, the time integrator comprising:

a pulse generation circuit configured to convert a time difference between edges of two input signals to a difference between pulse widths of two pulse signals, and to output the two pulse signals;

a load circuit having load characteristics changed by the two pulse signals; and an oscillation circuit coupled to the load circuit, and having an oscillation frequency changing in accordance with the load characteristics of the load circuit, wherein an output of the oscillation circuit is output as a result of time integration, each of the load circuits includes a plurality of variable capacitance circuits, each being configured to receive one or the other of the two pulse signals, and having a capacitance value varying in accordance with a logic level of the received pulse signal, and each of the oscillation circuits includes an oscillator coupled to the plurality of variable capacitance circuits, and having an oscillation frequency in accordance with a total capacitance value of the coupled variable capacitance circuits.

4. A time integrator integrating time axis information represented by a phase difference between two signals, the time integrator comprising:

a pulse generation circuit configured to convert a time difference between edges of two input signals to a difference between pulse widths of two pulse signals, and to output the two pulse signals;

a load circuit having load characteristics changed by the two pulse signals; and an oscillation circuit coupled to the load circuit, and having an oscillation frequency changing in accordance with the load characteristics of the load circuit, wherein an output of the oscillation circuit is output as a result of time integration, the pulse generation circuit includes another pulse generation circuit;

the load circuit includes another load circuit, another two signals are input to the another pulse generation circuit, each of the load circuits includes a plurality of variable capacitance circuits, each being configured to receive one or the other of the two pulse signals, and having a capacitance value varying in accordance with a logic level of the received pulse signal, and each of the oscillation circuits includes an oscillator coupled to the plurality of variable capacitance circuits, and having an oscillation frequency in accordance with a total capacitance value of the coupled variable capacitance circuits.

5. The time integrator of claim 1, wherein
the oscillator includes a ring oscillator formed by coupling a plurality of delay elements in a ring, and
each of the variable capacitance circuits is coupled to one of output nodes of the delay elements forming the ring oscillator.

6. The time integrator of claim 3, wherein
the oscillator is a ring oscillator formed by coupling a plurality of delay elements in a ring, and
the variable capacitance circuit is coupled to output nodes of the delay elements forming the ring oscillator.

7. The time integrator of claim 1, wherein
the oscillator includes an LC oscillator, and
the variable capacitance circuits are coupled to an output node of the LC oscillator.

8. The time integrator of claim 3, wherein
the oscillator includes an LC oscillator, and
the variable capacitance circuits are coupled to an output node of the LC oscillator.

9. The time integrator of claim 1, wherein each of the variable capacitance circuits includes a transistor having a source and a drain, any one of which is electrically floating and the other is coupled to the oscillator, and a gate receiving the pulse signal or logic inversion of the pulse signal as a control signal.

10. The time integrator of claim 3, wherein each of the variable capacitance circuits includes a transistor having a source and a drain, any one of which is electrically floating and the other is coupled to the oscillator, and a gate receiving the pulse signal or logic inversion of the pulse signal as a control signal.

11. The time integrator of claim 9, wherein
each of the variable capacitance circuits includes another transistor having opposite polarity to the transistor, and
the another transistor has a source and a drain, any one of which is electrically floating and the other is coupled to the oscillator, and a gate receiving logic inversion of the control signal.

12. The time integrator of claim 10, wherein
each of the variable capacitance circuits includes another transistor having opposite polarity to the transistor, and
the another transistor has a source and a drain, any one of which is electrically floating and the other is coupled to the oscillator, and a gate receiving logic inversion of the control signal.

13. A ΔΣ time-to-digital converter converting time axis information represented by a phase difference between two signals to a digital value, the ΔΣ time-to-digital converter comprising:
- a time integrator; integrating time axis information represented by a phase difference between two signals, the time integrator comprising:
  - a pulse generation circuit configured to convert a time difference between edges of two input signals to a difference between pulse widths of two pulse signals, and to output the two pulse signals;
  - a load circuit having load characteristics changed by the two pulse signals; and
  - an oscillation circuit coupled to the load circuit, and having an oscillation frequency changing in accordance with the load characteristics of the load circuit,
  - wherein an output of the oscillation circuit is output as a result of time integration,
  - the pulse generation circuit includes another pulse generation circuit;
  - the load circuit includes another load circuit, and another two signals are input to the another pulse generation circuit,
- a time quantizer configured to quantize an output of the time integrator; and
- a digital-to-time converter configured to convert a quantized output of the time quantizer to a time difference between edges of two signals, and to output the two signals,
- wherein the two signals output from the digital-to-time converter are input to one of the two pulse generation circuits of the time integrator.

14. The ΔΣ time-to-digital converter of claim 13, wherein the time integrator outputs two signals having a phase difference corresponding to the result of time integration, and
the time quantizer quantizes the phase difference between the two signals output from the time integrator.

15. The ΔΣ time-to-digital converter of claim 14, wherein the time quantizer includes:
- a phase comparator configured to compare phases of the two signals output from the time integrator,
- a one-shot pulse generator configured to generate a one-shot pulse, and
- a latch circuit configured to latch an output of the phase comparator at timing of the one-shot pulse, and
the digital-to-time converter includes:
- a delay circuit configured to receive the one-shot pulse, and to delay and output the received one-shot pulse, and
- a swap circuit configured to receive the one-shot pulse and the one-shot pulse delayed and output by the delay circuit, and to interchange and output the input pulses in accordance with an output of the latch circuit.

16. The ΔΣ time-to-digital converter of claim 13, wherein the time integrator outputs a signal reflecting the result of time integration as a phase difference from a sampling clock signal, and
the time quantizer quantizes a phase difference between the sampling clock signal and the signal output from the time integrator.

17. The ΔΣ time-to-digital converter of claim 16, wherein the time quantizer includes:
- a phase comparator configured to compare phases of the sampling clock signal and the signal output from the time integrator,
- a one-shot pulse generator configured to generate a one-shot pulse, and
- a latch circuit configured to latch an output of the phase comparator at timing of the one-shot pulse, and
the digital-to-time converter includes:
- a delay circuit configured to receive the one-shot pulse, and to delay and output the received one-shot pulse, and
- a swap circuit configured to receive the one-shot pulse and the one-shot pulse delayed and output by the delay circuit, and to interchange and output the input pulses in accordance with an output of the latch circuit.

18. The ΔΣ time-to-digital converter of claim 13, wherein the oscillation circuit of the time integrator includes a ring oscillator formed by coupling a plurality of delay elements in a ring,
the time integrator outputs a multi-bit signal formed by outputs of the delay elements forming the ring oscillator, and
the time quantizer latches the multi-bit signal output from the time integrator at timing of a sampling clock signal, and converts an output of the time integrator to a multi-bit value.

19. The ΔΣ time-to-digital converter of claim 18, wherein an integration gain of the time axis information represented by a phase difference between the two signals output from the digital-to-time converter changes in accordance with an output of the time quantizer.

20. The ΔΣ time-to-digital converter of claim 18, wherein a time difference between edges of the two signals output from the digital-to-time converter changes in accordance with an output of the time quantizer.

21. The ΔΣ time-to-digital converter of claim 13, further comprising:
- another one of the time integrator,
- an output of the another time integrator is coupled to an input of the time integrator, and
- the two signals output from the digital-to-time converter are input to one of two pulse generation circuits of the another time integrator.

22. The ΔΣ time-to-digital converter of claim 13, further comprising:
- a counter circuit configured to count the oscillation frequency of the oscillation circuit of the time integrator; and
- a frequency control circuit configured to control the oscillation frequency of the oscillation circuit based on an output of the counter circuit.

23. The ΔΣ time-to-digital converter of claim 13, further comprising:
- a phase slip detection circuit configured to detect phase slip of the oscillation circuit of the time integrator; and
- a correction circuit configured to correct a digital value output from the time quantizer based on an output of the phase slip detection circuit.

* * * * *